(12) United States Patent
Zhang et al.

(10) Patent No.: US 9,245,998 B2
(45) Date of Patent: Jan. 26, 2016

(54) HIGH VOLTAGE MULTIPLE CHANNEL LDMOS

(71) Applicant: Texas Instruments Incorporated, Dallas, TX (US)

(72) Inventors: Yongxi Zhang, Plano, TX (US); Sameer P. Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/578,710

(22) Filed: Dec. 22, 2014

(65) Prior Publication Data

US 2015/0187934 A1 Jul. 2, 2015

Related U.S. Application Data

(60) Provisional application No. 61/921,506, filed on Dec. 29, 2013.

(51) Int. Cl.
| | | |
|---|---|---|
| *H01L 29/78* | (2006.01) | |
| *H01L 29/76* | (2006.01) | |
| *H01L 21/336* | (2006.01) | |
| *H01L 27/092* | (2006.01) | |
| *H01L 29/66* | (2006.01) | |
| *H01L 21/8238* | (2006.01) | |

(52) U.S. Cl.
CPC .... *H01L 29/7817* (2013.01); *H01L 21/823807* (2013.01); *H01L 27/0922* (2013.01); *H01L 29/66712* (2013.01); *H01L 29/7802* (2013.01); *H01L 29/7809* (2013.01)

(58) Field of Classification Search
CPC ............ H01L 29/7802; H01L 29/7809; H01L 29/7817; H01L 29/66712; H01L 27/0922; H01L 21/807; H01L 21/823
USPC .......... 438/197, 200, 209, 268; 257/288, 329, 257/330, 331, 335, 336, 338, 339, 343, 257/E21.214, E21.417, E29.063, E29.066, 257/E29.256

See application file for complete search history.

(56) References Cited

U.S. PATENT DOCUMENTS

| | | | | |
|---|---|---|---|---|
| 6,593,621 | B2 * | 7/2003 | Tsuchiko ............ | H01L 29/7801 257/335 |
| 2009/0273028 | A1 * | 11/2009 | Mallikarjunaswamy | H01L 21/26513 257/335 |
| 2011/0127602 | A1 * | 6/2011 | Mallikarjunaswamy | H01L 21/823807 257/331 |
| 2013/0270636 | A1 * | 10/2013 | Ito ........................ | H01L 29/7835 257/336 |
| 2014/0167144 | A1 * | 6/2014 | Tsuchiko ........ | H01L 21/823418 257/329 |

* cited by examiner

*Primary Examiner* — Dao H Nguyen

(74) *Attorney, Agent, or Firm* — Jacqueline J. Garner; Frank D. Cimino

(57) ABSTRACT

An integrated circuit and method having an LDMOS transistor with multiple current channels. A first current channel is above a buried p-type diffusion and a second one current channel is below the buried p-type diffusion.

6 Claims, 51 Drawing Sheets

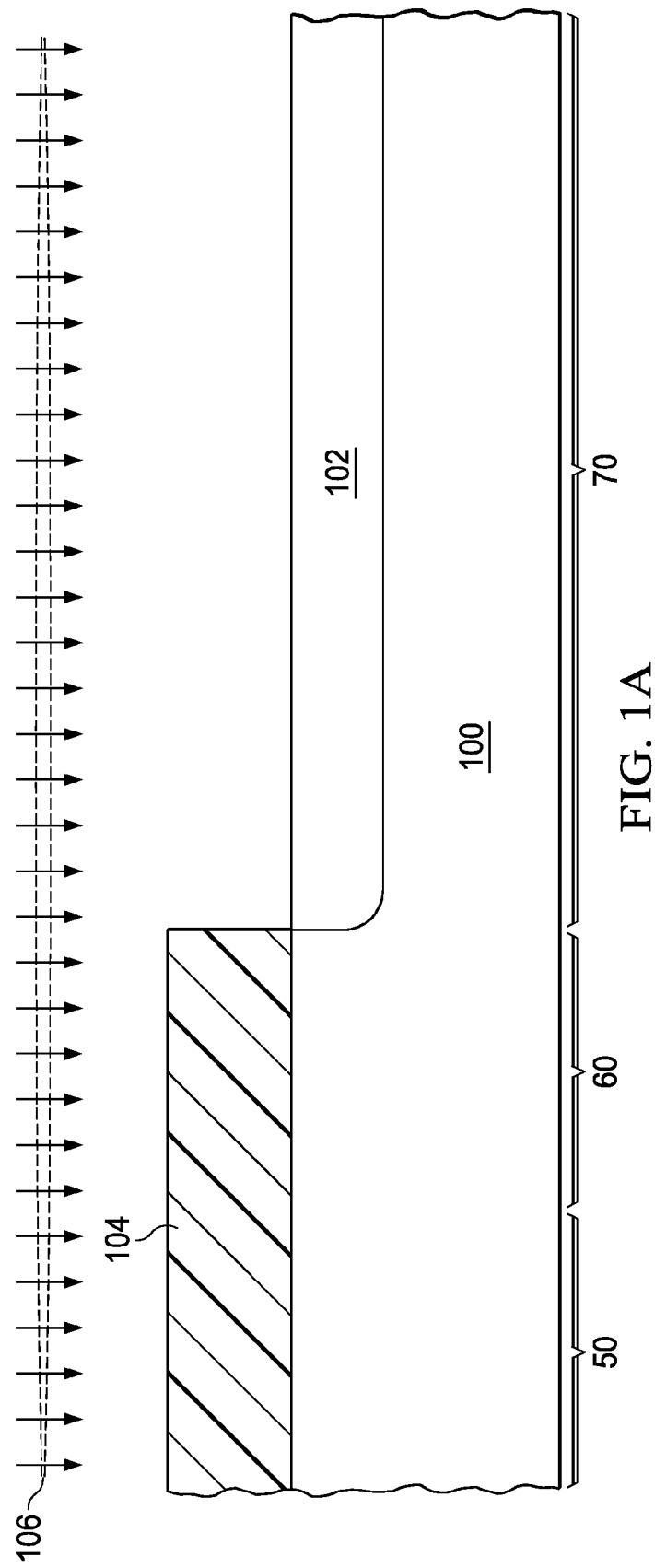

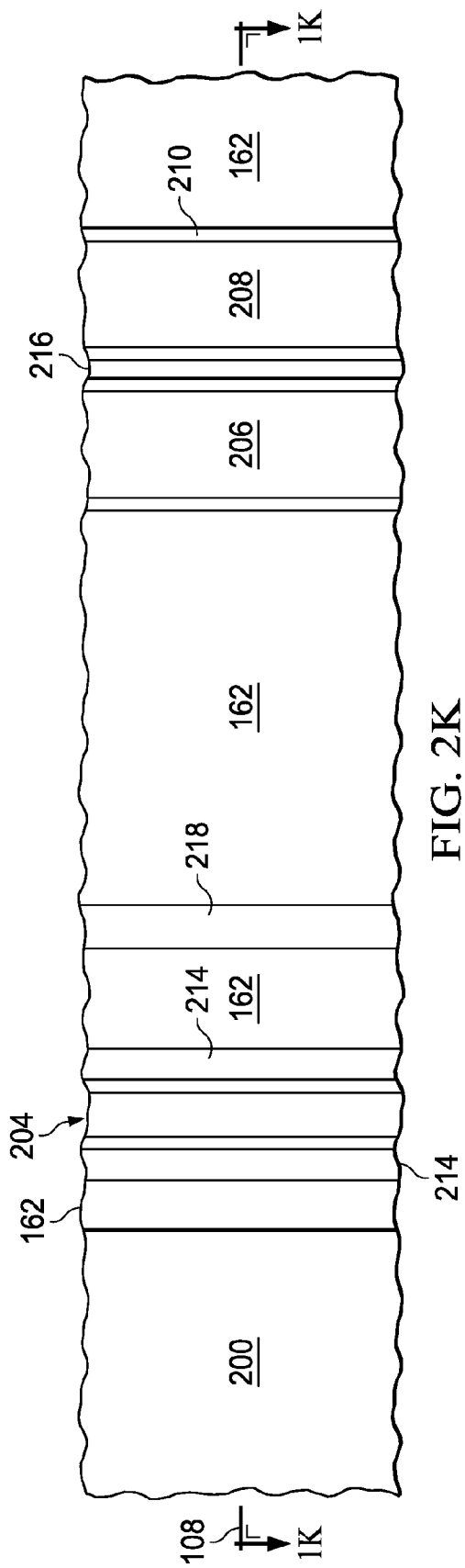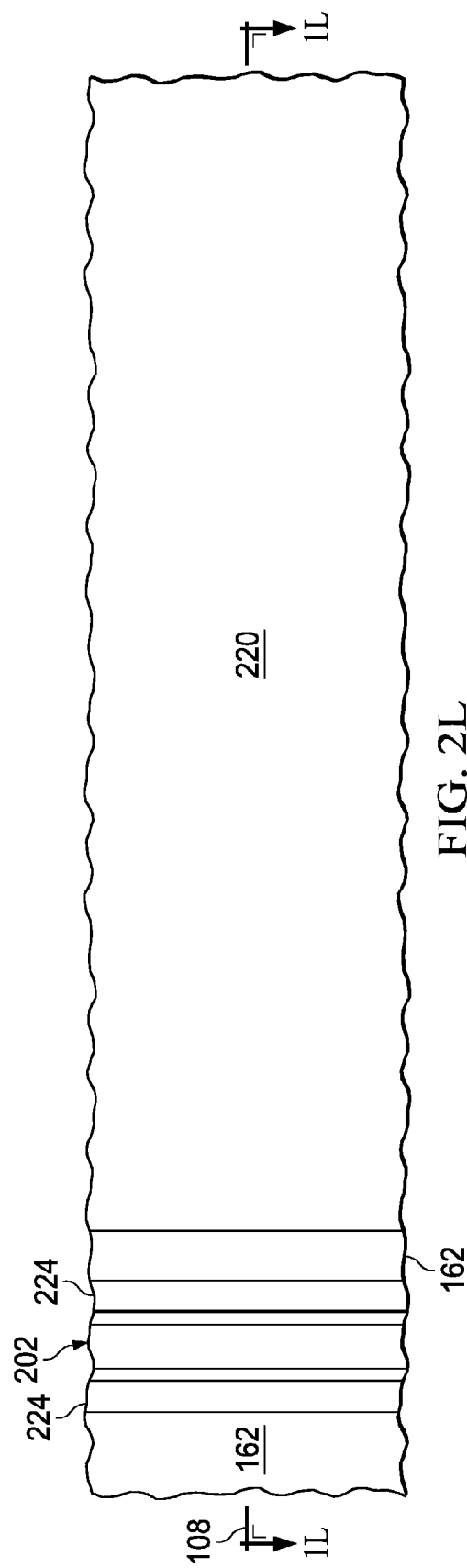

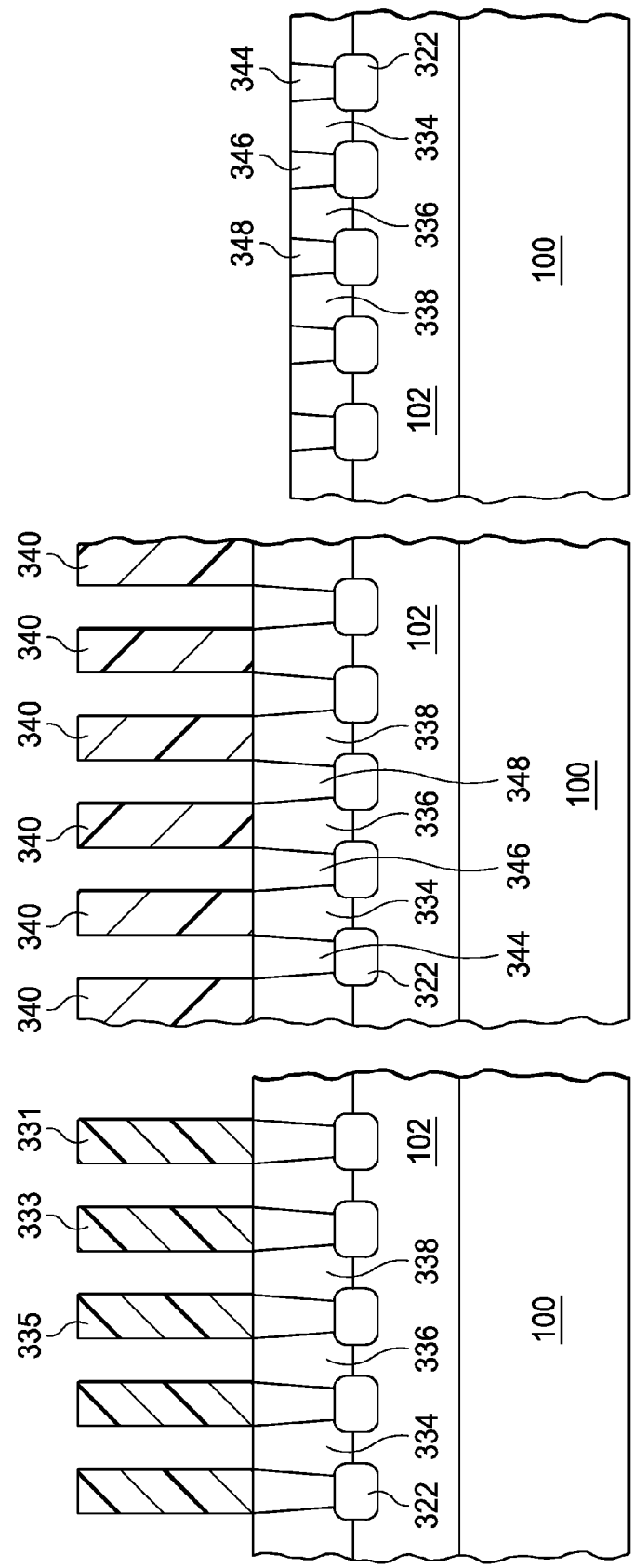

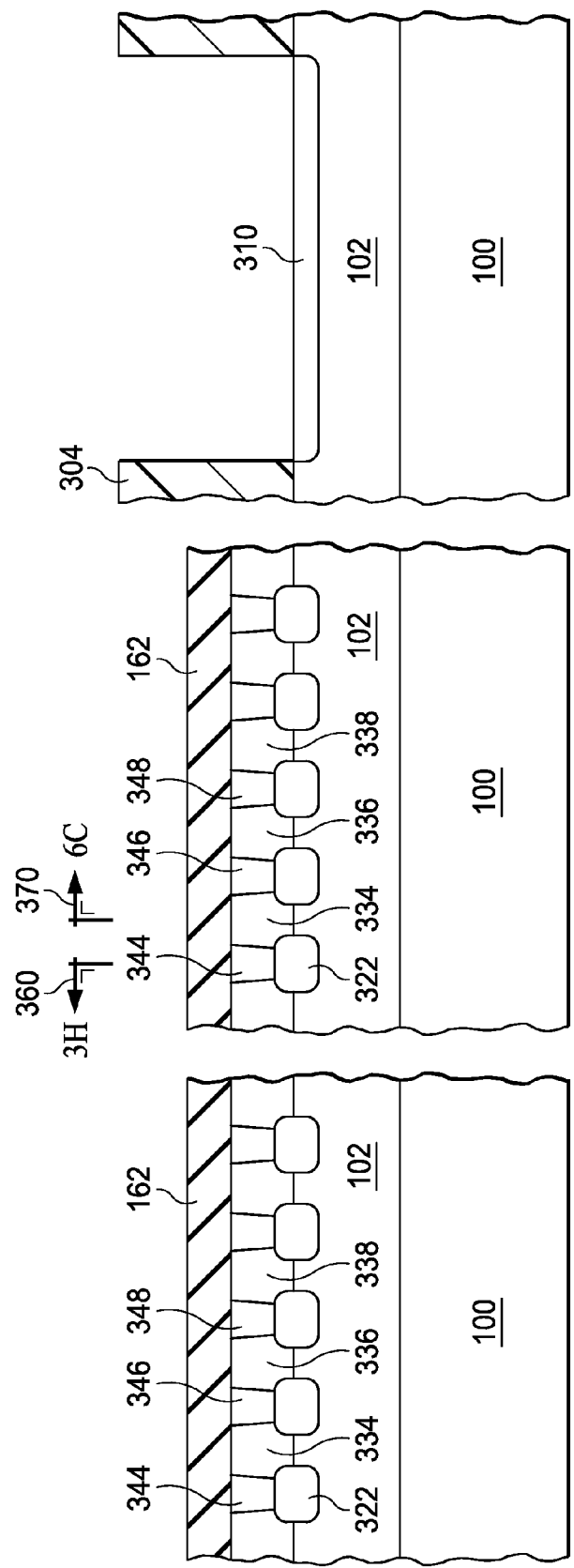

HIGH VOLTAGE MULTIPLE CHANNEL LDMOS

CROSS-REFERENCE TO RELATED APPLICATIONS

This application claims the benefit of priority under U.S.C. §119(e) of U.S. Provisional Application 61/921,506, filed Dec. 29, 2013, the contents of which are hereby incorporated by reference.

FIELD OF INVENTION

This invention relates to the field of integrated circuits. More particularly, this invention relates to integrated circuits with lateral diffused (LDMOS) transistors.

BACKGROUND

Modern digital VLSI circuits commonly operate at 2.5 volts or below. However, integrated circuits often have additional on chip circuits operating at higher voltages. Example circuits are input/output interface circuits with various off-chip system components such as power management switches, analog input circuits conditioning transducer signals, or output analog drive functions for speakers or other actuators.

One solution to this problem is to use multiple gate oxide thicknesses and to build both low voltage and high voltage transistors on the same chip. This method increases process complexity and cost. An alternative solution is to use lateral diffused metal-oxide-semiconductor (LDMOS) transistors that can operate with higher drain voltages with little or no additional process complexity and cost. In an LDMOS transistor a lightly doped lateral diffused drain region is constructed between the heavily doped drain contact and the transistor channel region. A depletion region forms in this lightly doped lateral diffused region resulting in a voltage drop between the drain contact and the transistor gate. With proper design, sufficient voltage may be dropped between the drain contact and the gate dielectric to allow a low gate voltage transistor to be used as a switch for the high voltage.

Some integrated circuit chips such as driver chips provide high current at high voltages. LDMOS transistors on these circuits may be very large to supply the high current requirements. The LDMOS power transistor may occupy 50% or more of the driver chip area to meet power requirements.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit is formed with an LDMOS transistor structure that has multiple current channels enabling high current capability in a small area. A first current channel may be above a buried p-type diffusion and a second current channel may be below the buried p-type diffusion.

BRIEF DESCRIPTION OF THE DRAWINGS

FIGS. 1A-1M are cross section illustrations of steps in the fabrication of integrated circuits formed according to principles of the invention.

FIGS. 2A-2M are top down illustrations of steps in the fabrication of integrated circuits formed according to principles of the invention.

FIGS. 4A-4H are cross section illustrations of steps in the fabrication of integrated circuits formed according to principles of the invention.

FIGS. 6A, 6B, and 6C are cross section illustrations of steps in the fabrication of integrated circuits formed according to principles of the invention.

FIGS. 11, 12, and 14 are cross section illustrations of an integrated circuit formed according to principles of the invention.

FIGS. 15, 16, and 18 are cross section illustrations of an integrated circuit formed according to principles of the invention

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Some integrated circuit chips such as driver chips provide high current at high voltage. Frequently lateral diffused metal-oxide-semiconductor (LDMOS) transistors are used to provide the high voltage and high current capability at low cost. LDMOS transistors may be added to a baseline CMOS process flow with few or no added lithography and dopant implantation steps. Frequently a high voltage LDMOS power transistor may occupy 50% or more of the driver chip area.

Embodiment LDMOS transistors provide high current at high voltage with reduced area by providing multiple current channels between the drain and gate of the LDMOS. Since current in the embodiment LDMOS transistors may flow through multiple channels when the embodiment LDMOS transistor is turned on, the embodiment LDMOS transistor provides high current with reduced area. The embodiment multiple current channel LDMOS transistor significantly reduces the area required for the high voltage, high current transistor thereby significantly reducing cost.

The term "current channel" refers to a region of the semiconductor substrate through which current flows. One current channel may be isolated from a second current channel by a diffusion of opposite dopant type. One current channel may be shorted to the second current channel at the ends of the diffusion of opposite dopant type which separates the two current channels. The diffusion of opposite dopant type which separates the two current channels enables the current channels to fully deplete when the LDMOS transistor is turned off. The depleted region forms the LDMOS resistor across which the voltage drop of the LDMOS transistor occurs.

Figure 1B:
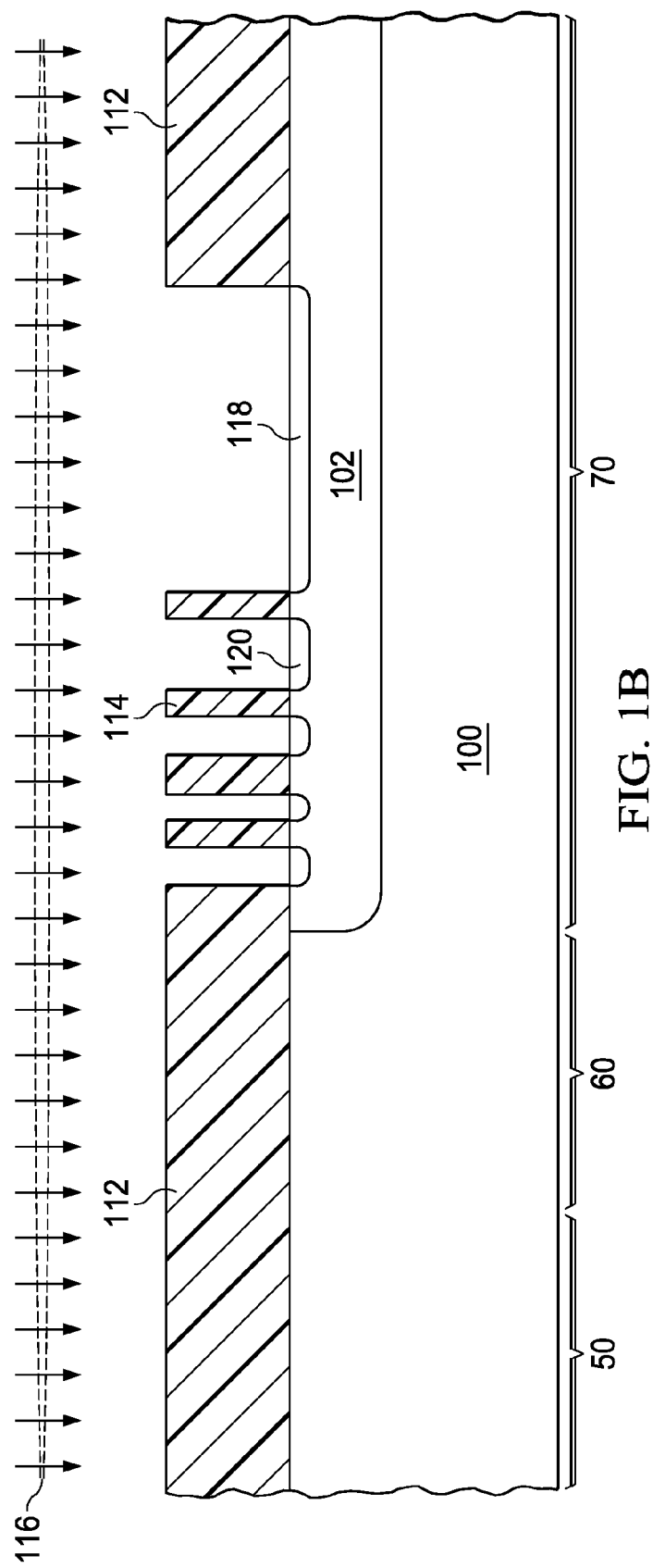
Figure 1C:
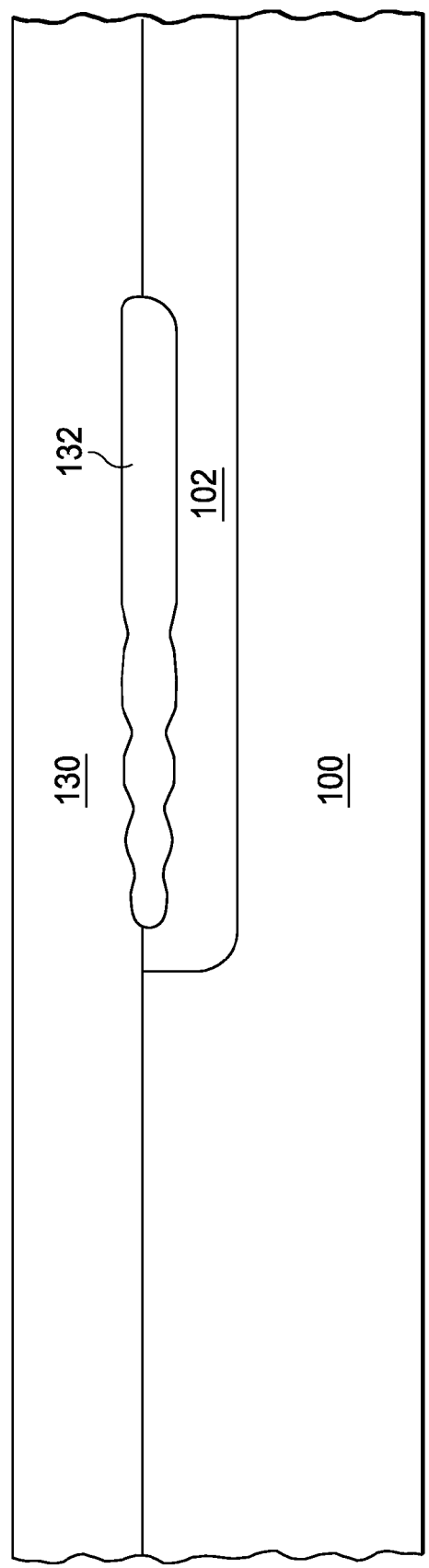
Figure 1D:
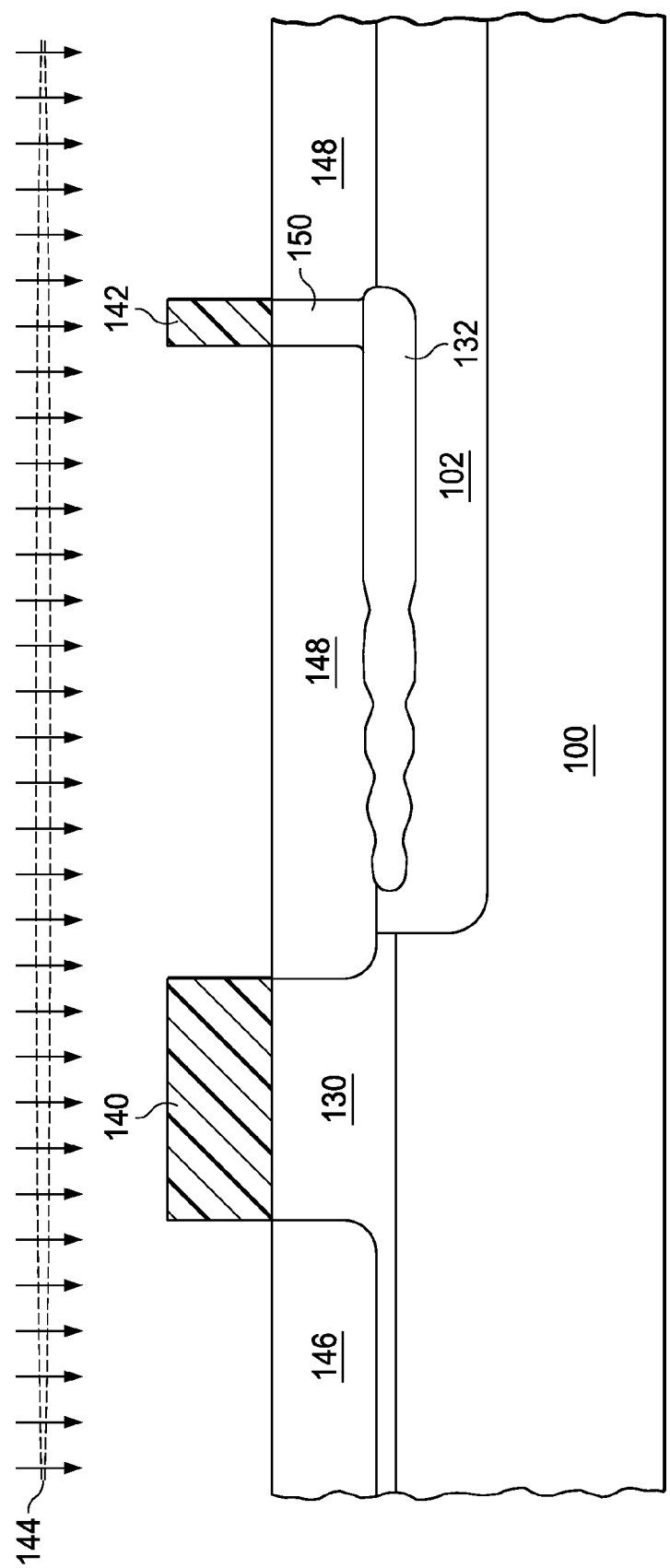
Figure 1E:
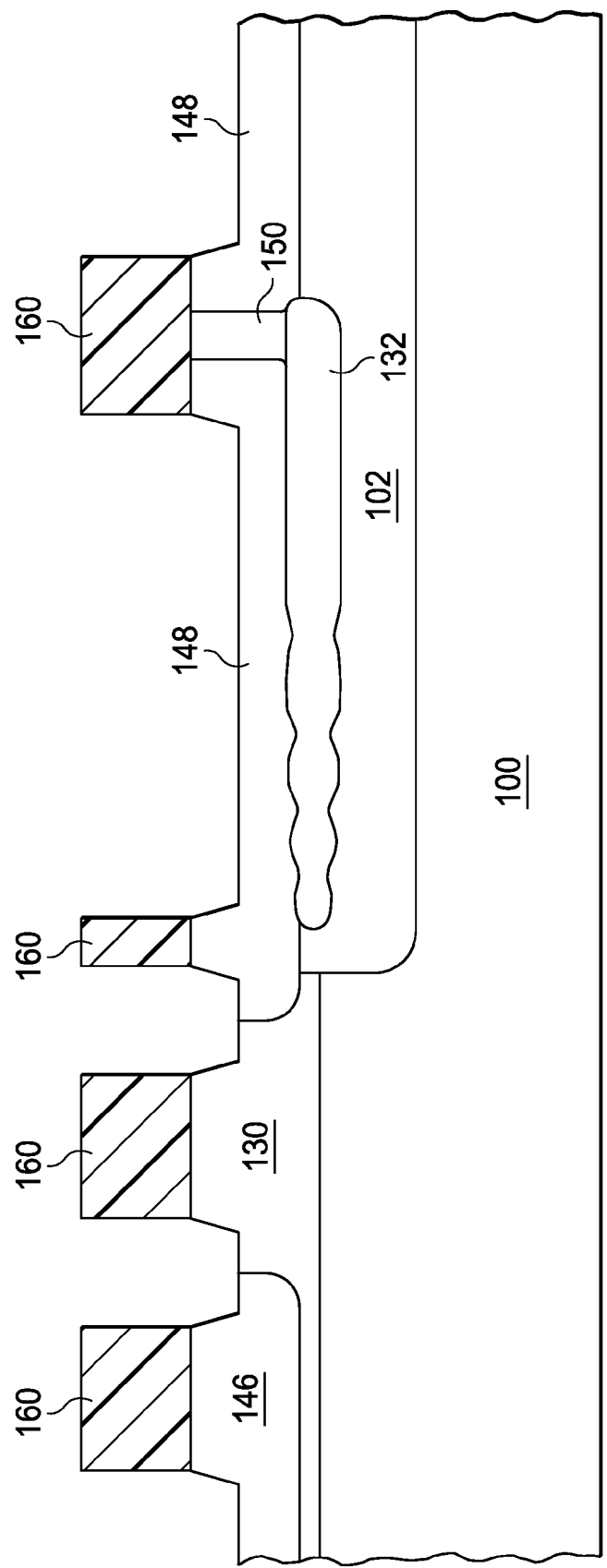
Figure 1F:
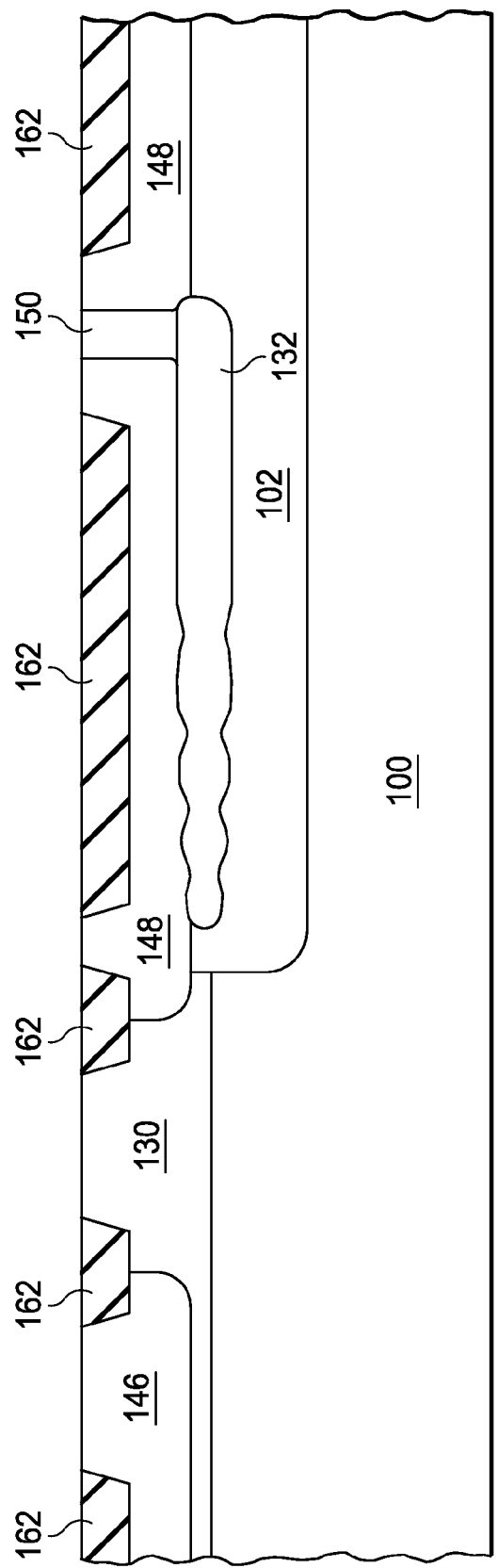
Figure 1G:
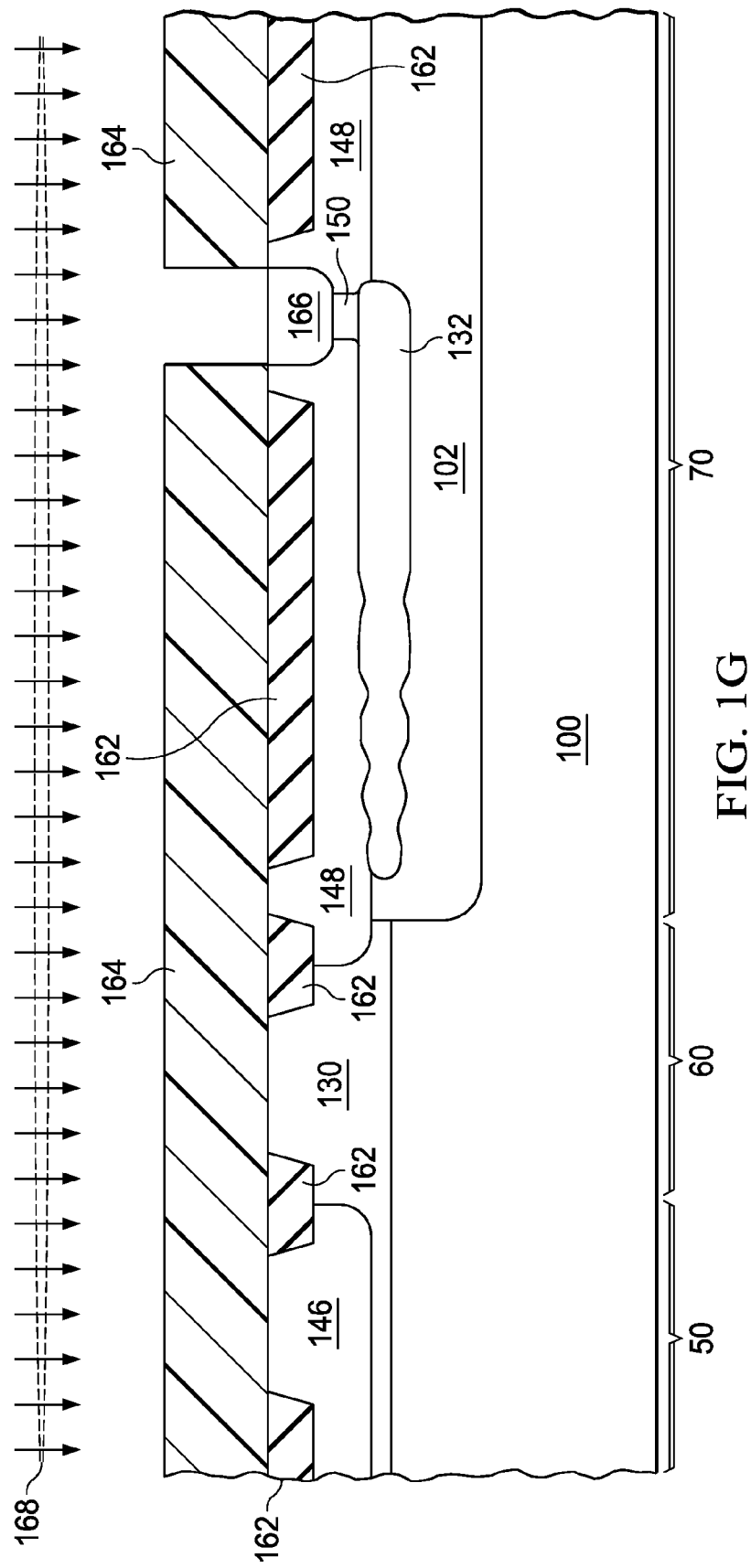
Figure 1H:
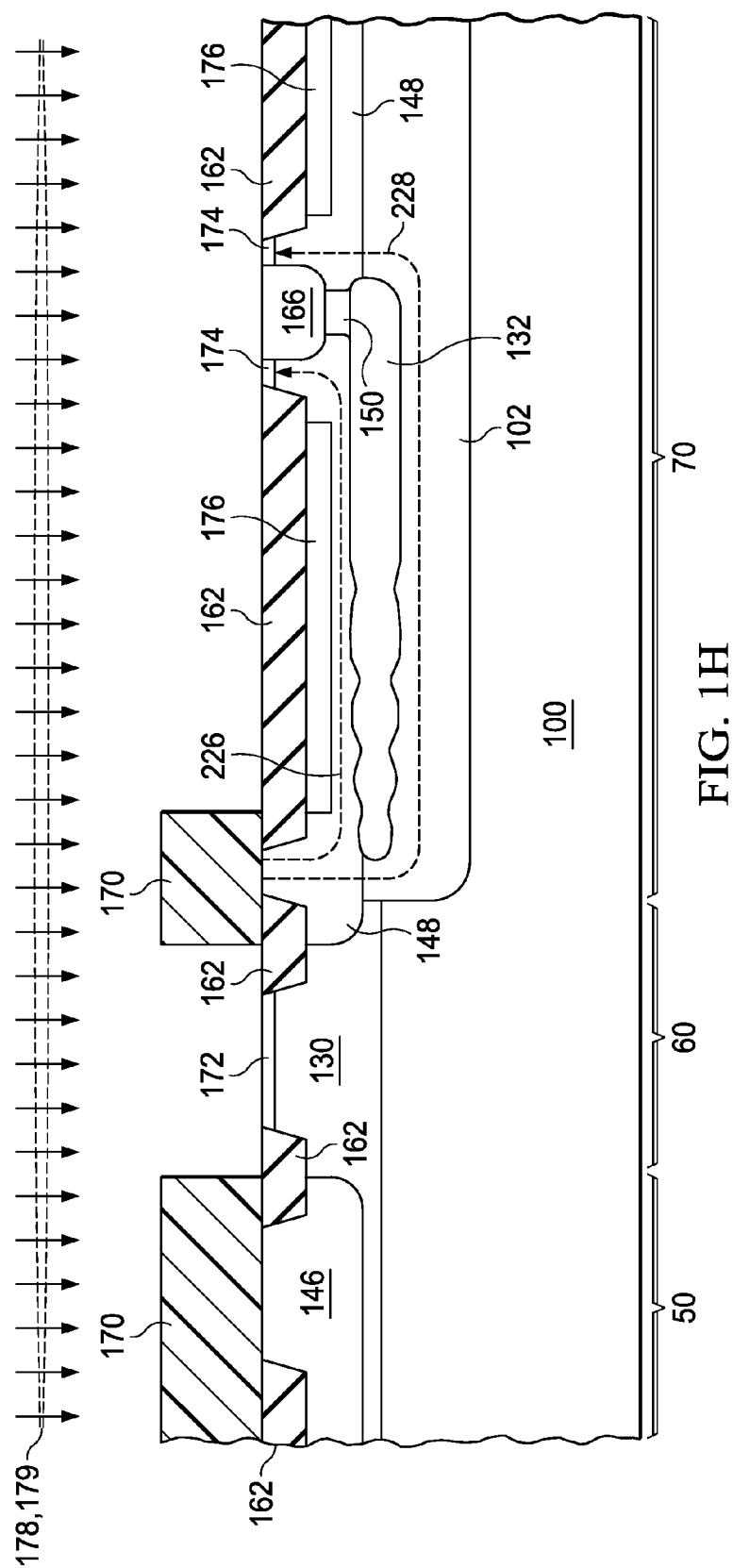
Figure 1I:
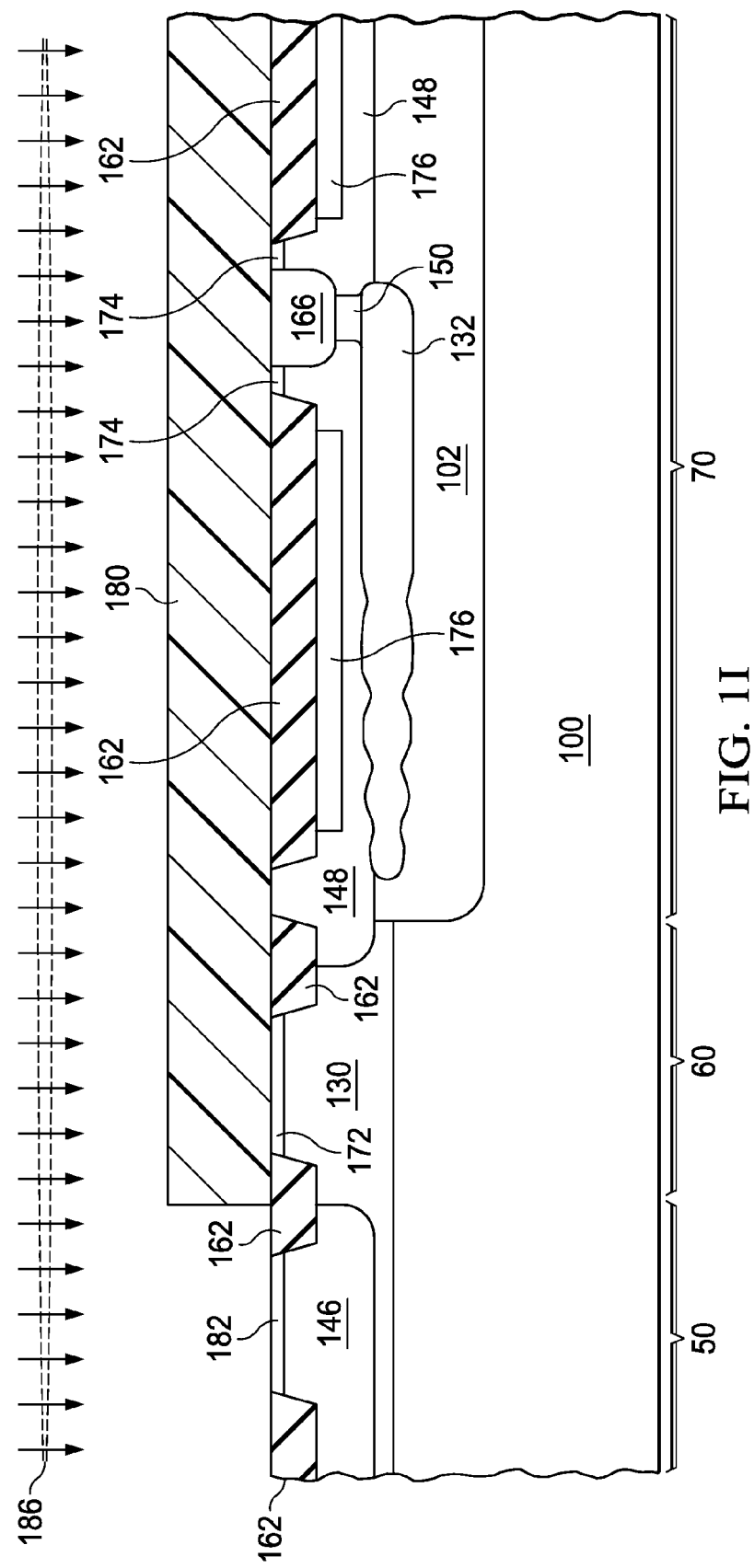
Figure 1J:
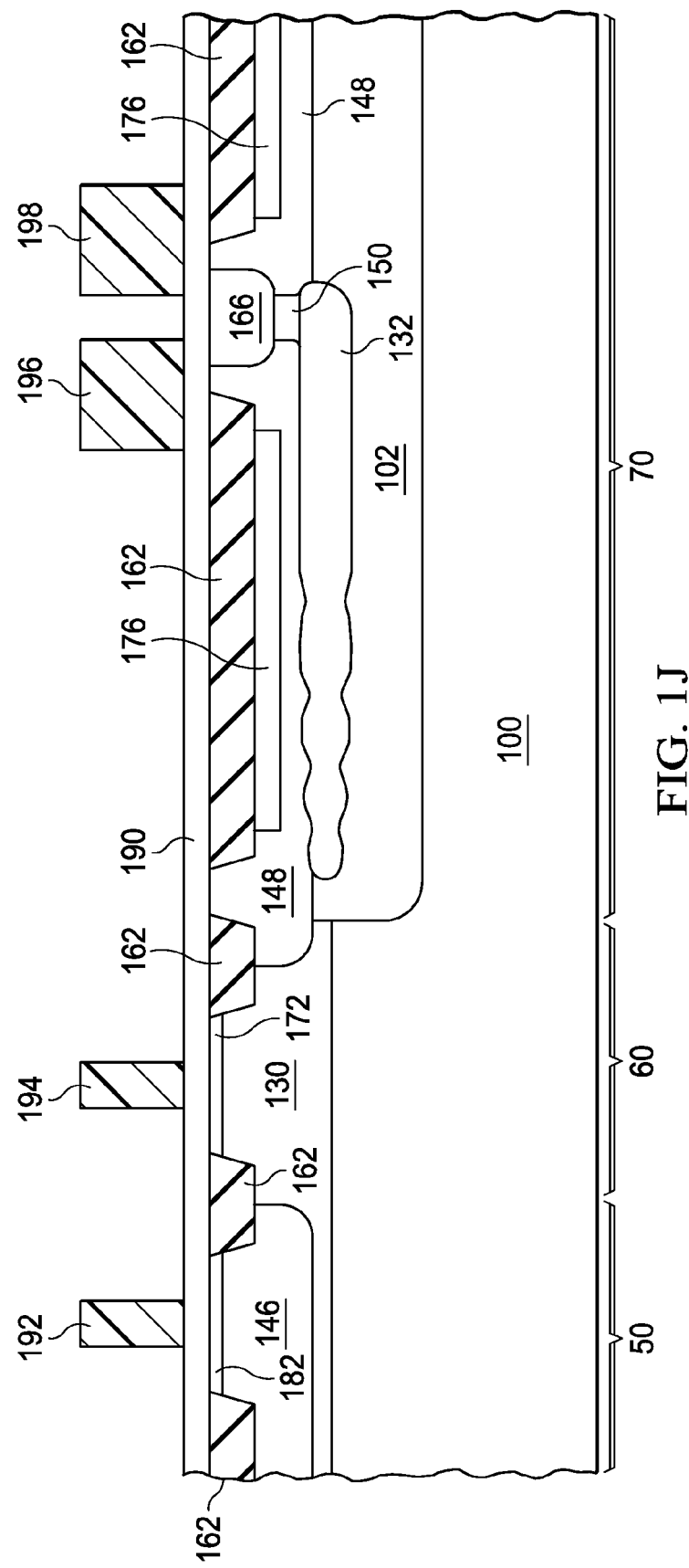
Figure 1K:
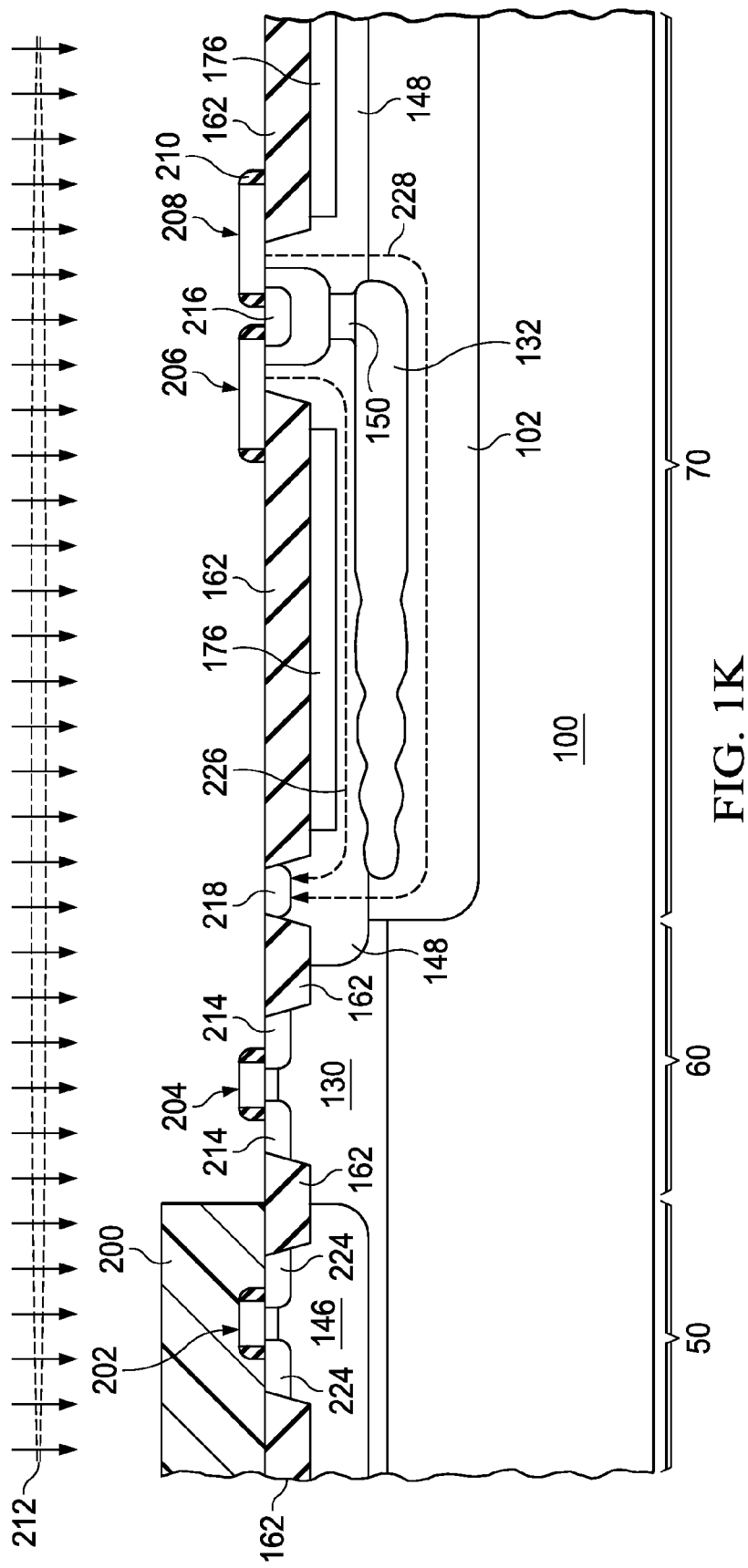
Figure 1L:
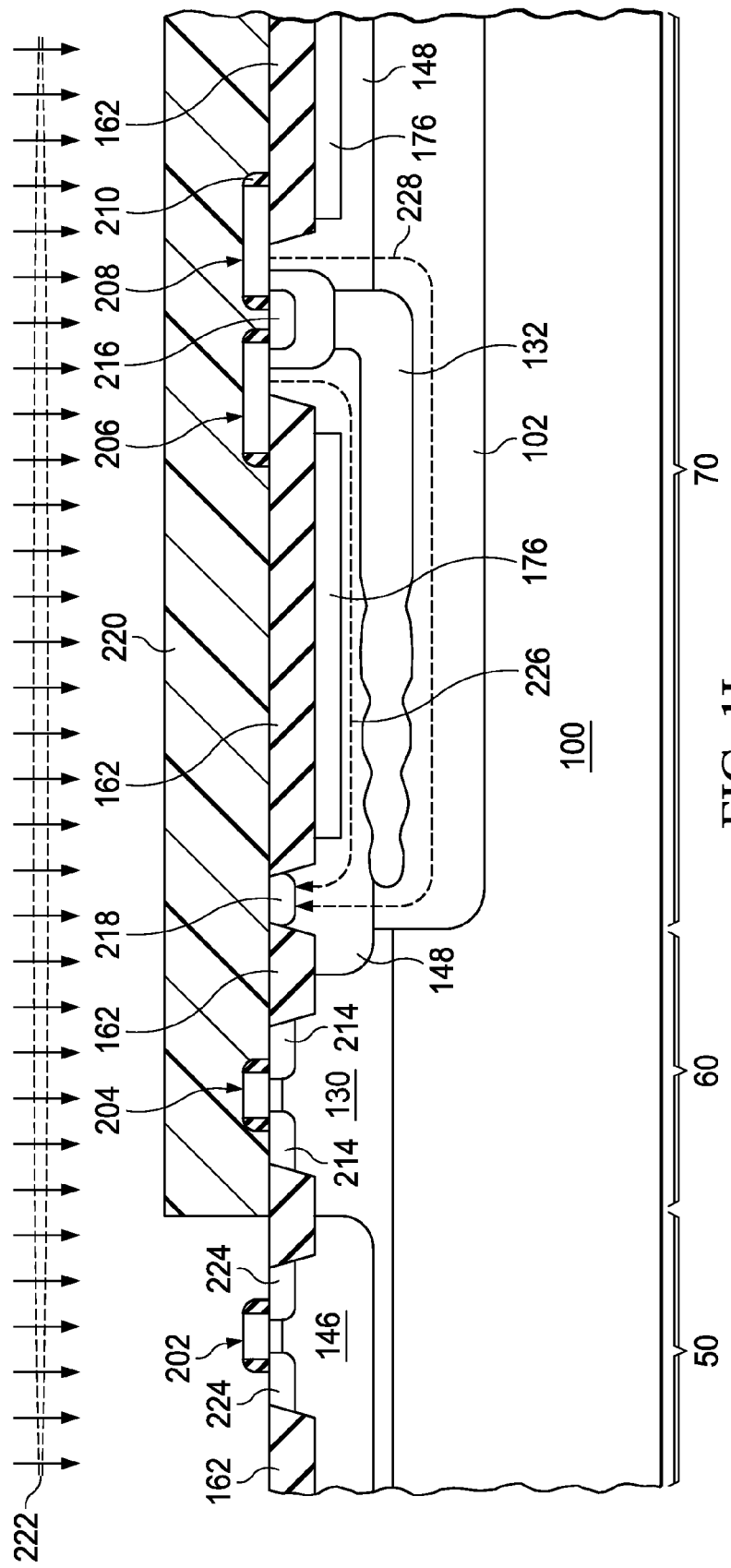
Figure 1M:
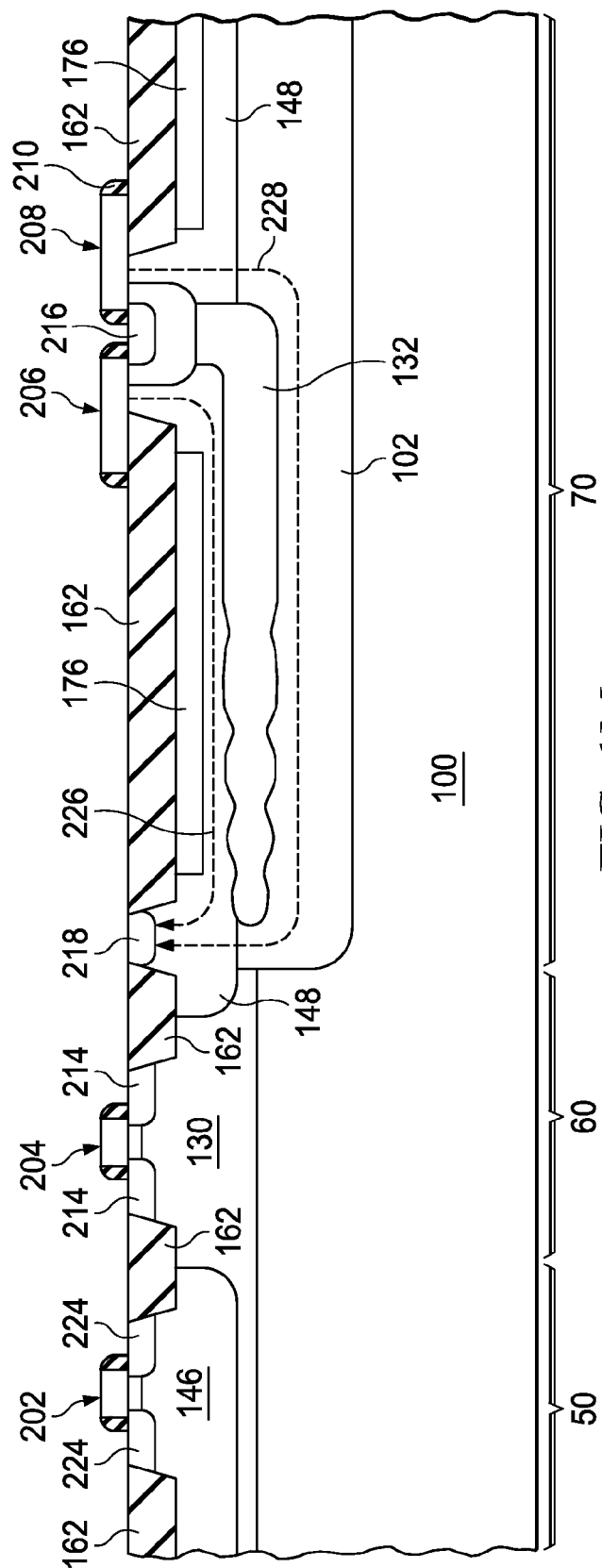
Figure 2A:
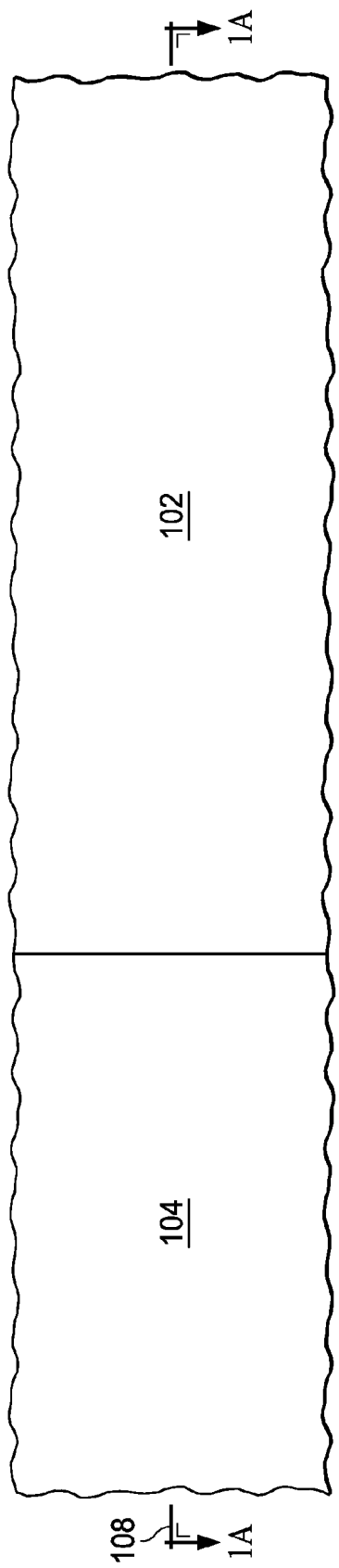
Figure 2B:
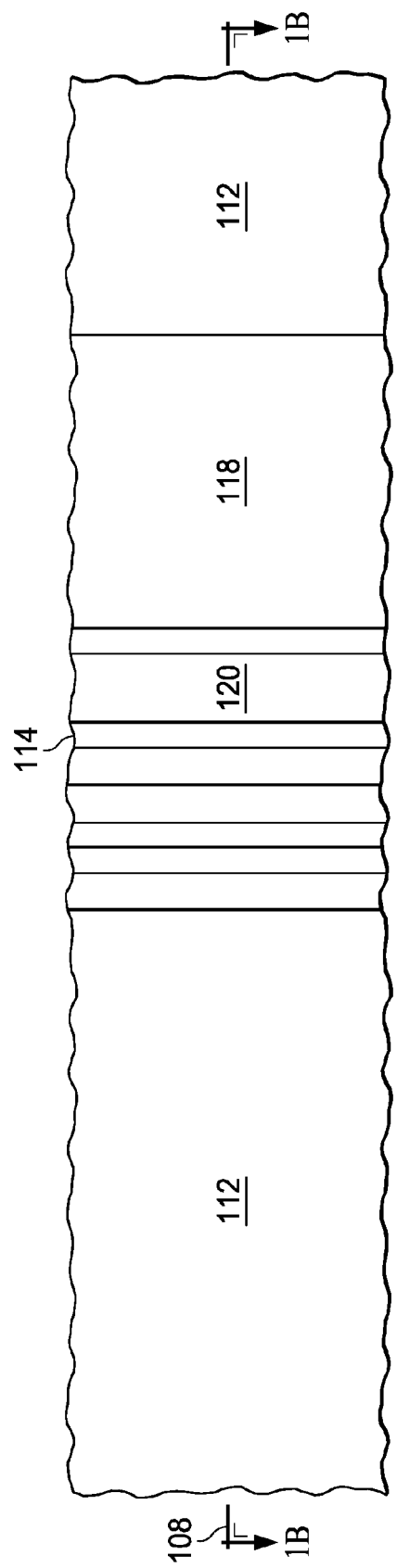
Figure 2C:
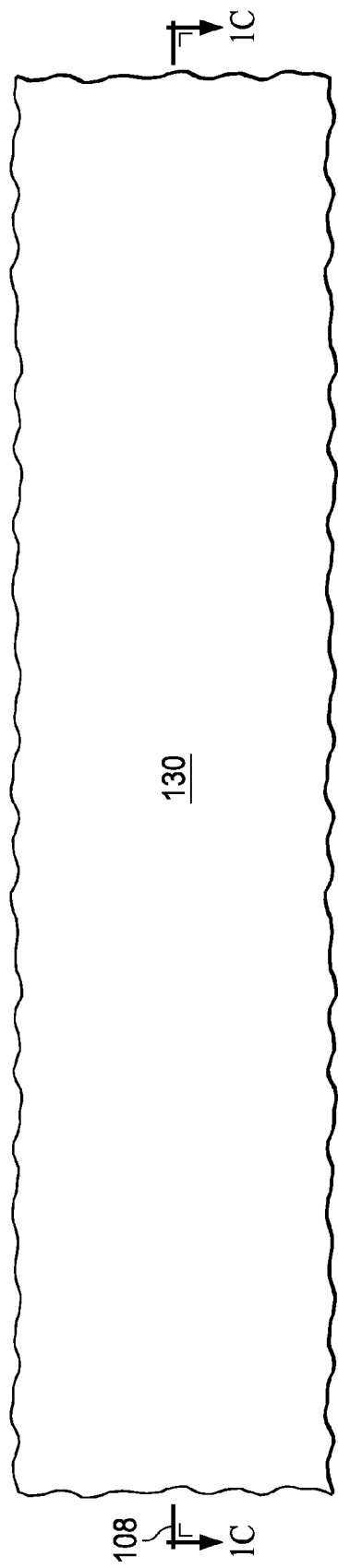
Figure 2D:
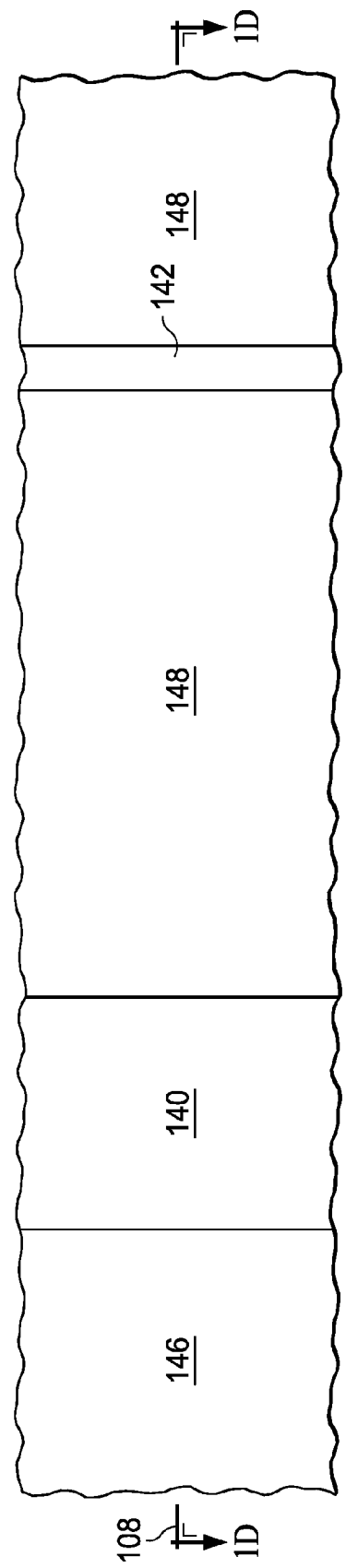
Figure 2E:
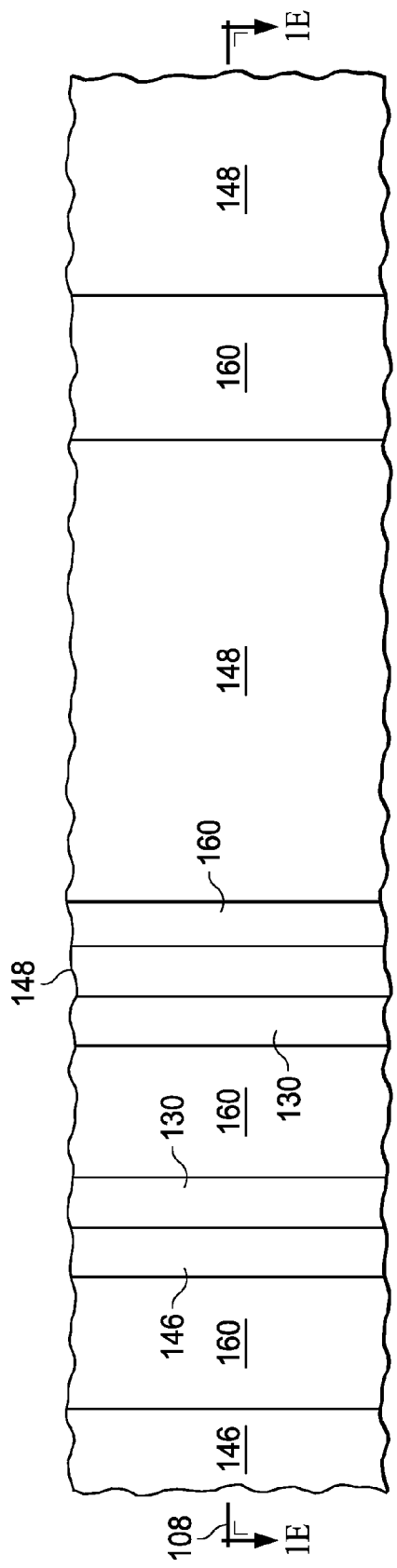
Figure 2F:
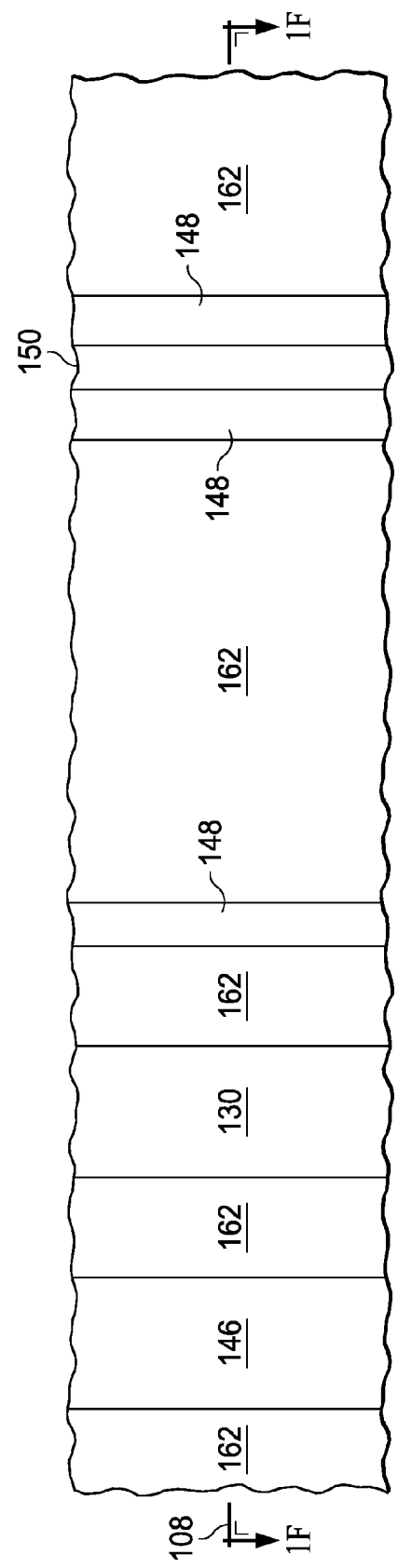
Figure 2G:
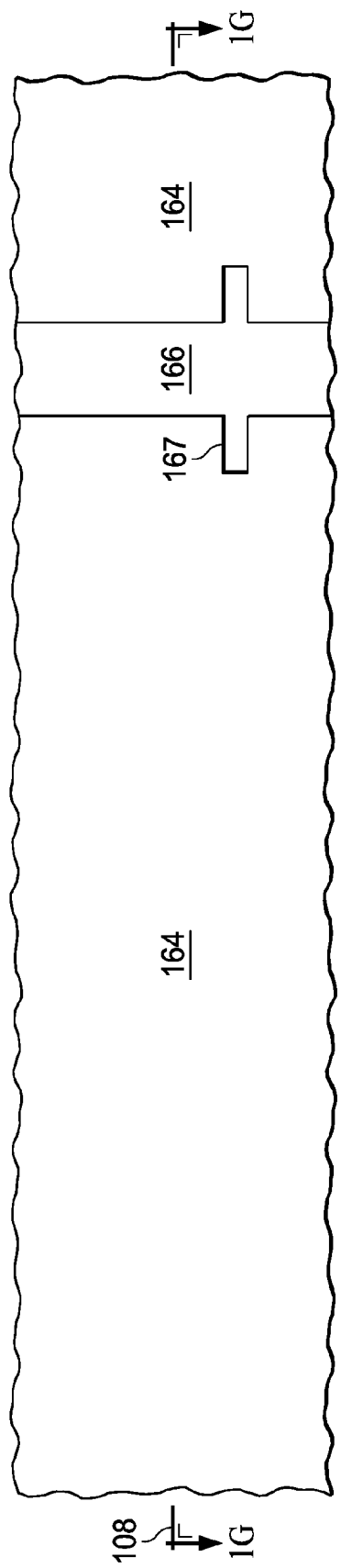
Figure 2H:
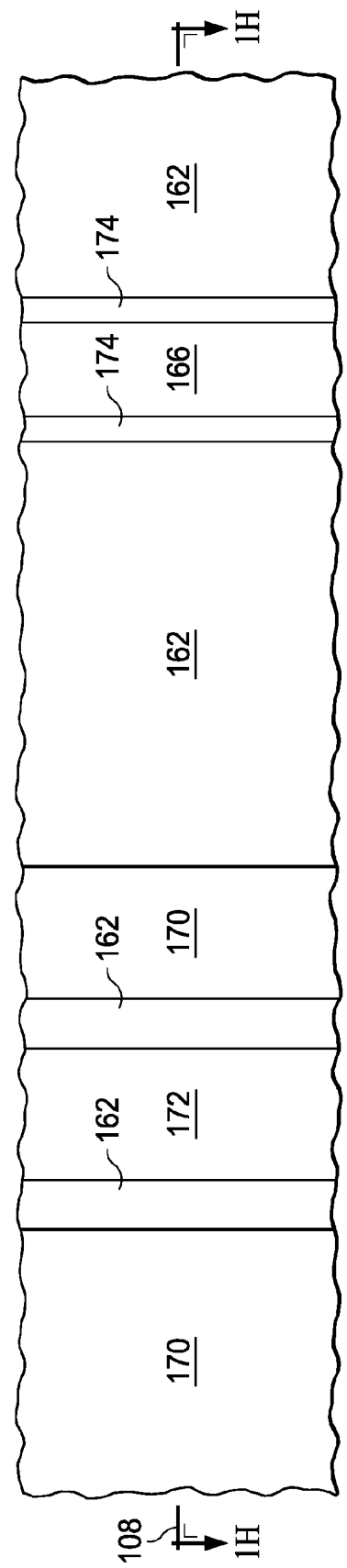
Figure 2I:
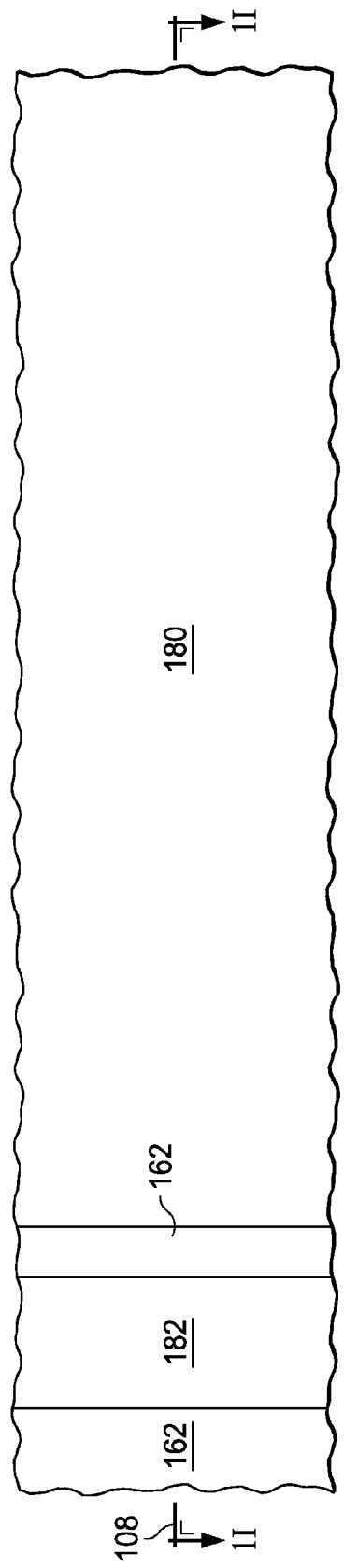
Figure 2J:
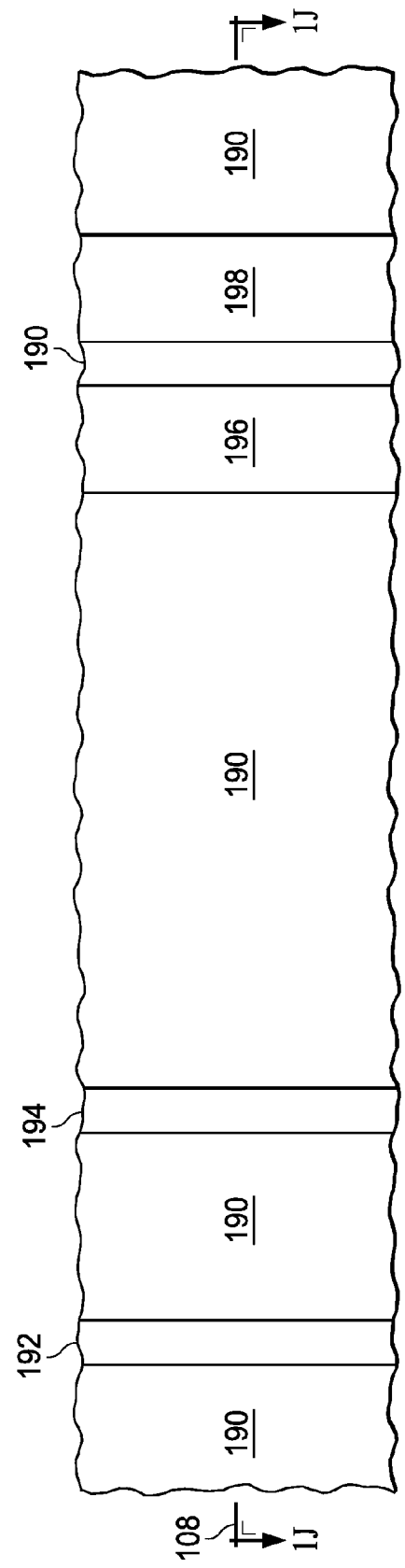
Figure 2M:
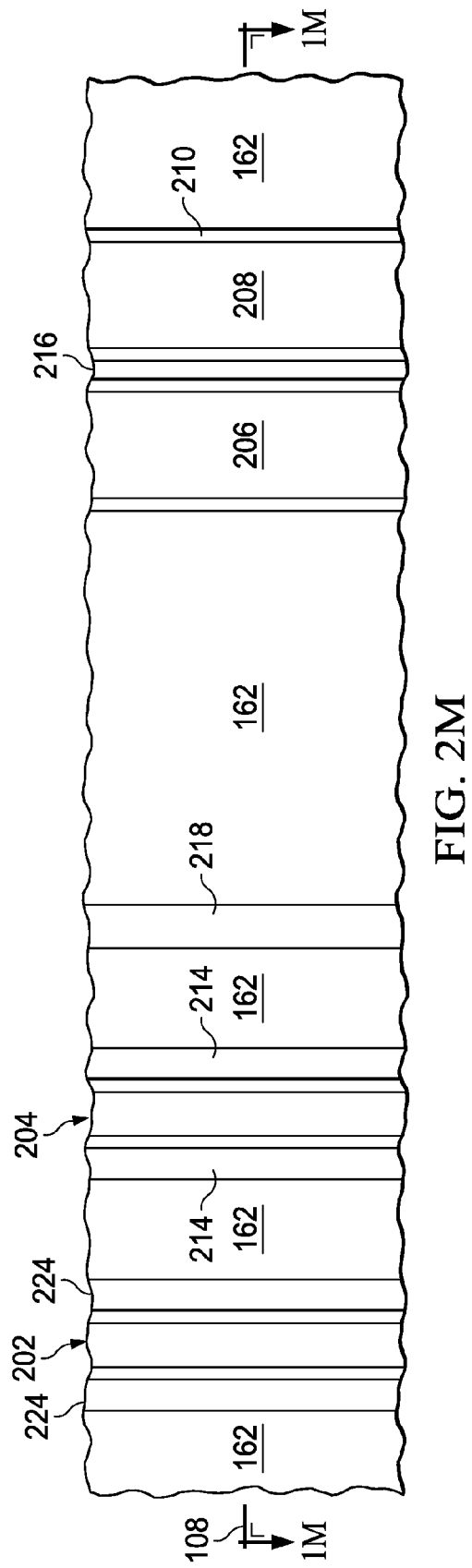

An example embodiment n-channel LDMOS (LDNMOS) integrated circuit with multiple horizontal current channels is illustrated in a cross sectional view in FIG. 1M and top down view in FIG. 2M. The example embodiment high current LDMOS transistor has two gates, 206 and 208, and two current channels, 226 and 228, between the drain 218 and source 216. Dashed lines 226 and 228 indicate current flow in the two current channels from drain 216 to source 218 in embodiment LDNMOS transistor formed in region 70. The higher current capability enables the embodiment LDNMOS transistor to be formed in a small area and still meet the current requirements. More than two horizontal current paths may be formed if desired. When embodiment LDNMOS transistor gate 206 is turned on current flows through the upper current path between the top p-type diffusion 174 and buried p-type diffusion 132. When embodiment LDNMOS transistor gate 208 is turned on current flows through the lower current path 228 under the buried p-type diffusion 132 and over the p-type substrate 100. When LDNMOS gates 206 and 208 are turned off and high voltage is applied to the LDNMOS drain 218, both current channels 226 and 228 fully deplete. Sufficient voltage is dropped across these depleted regions so that the LDMOS transistor gates, 206 and 208, may utilize the same low voltage gate dielectric as the logic transistors 50 and 60 to switch the high voltage.

The major manufacturing steps to build the embodiment LDNMOS transistor in region 70 in a CMOS manufacturing flow are illustrated in cross sections in FIGS. 1A through 1M and in top down views in FIGS. 2A through 2M.

In FIG. 1A a buried n-type diffusion (BND) photoresist pattern 104 is formed on a p-type substrate 100. N-type dopant 106 is implanted to form the BND diffusion 102. The BND implant may be phosphorus with a doping concentration in the range of $3E12/cm^2$ to $8E12/cm^2$ implanted with an energy in the range of about 500 KeV to 3000 KeV. A BND anneal may be performed to activate the n-type dopant and to drive the BND to a desired depth.

A core logic PMOS transistor is formed in region 50, a core logic NMOS transistor in region 60, and an embodiment LDNMOS transistor in region 70. The cross section in FIG. 1A is taken along line 108 through the top down view in FIG. 2A.

In FIG. 1B a buried p-type diffusion (BPD) photoresist pattern 112 is formed on the integrated circuit wafer. P-type dopant 116 is implanted to form the BPD doped regions 118 and 120 in the BND 102. The p-type dopant may be boron with a concentration in the range of about $3E12/cm^2$ to $1E13/cm^2$ implanted with an energy in the range of about 50 KeV to 300 KeV.

As illustrated in FIG. 1B, optional photoresist geometries 114 may be added to block the implant within the BND 102. Upon anneal BPD doped regions 118 and 120 merge forming a continuous BPD. In the BPD regions where the p-type dopant has been partially blocked, the p-type dopant concentration is reduced. Lowering the BPD dopant concentration towards the drain end of the embodiment LDNMOS transistor results in a more uniform electric field between the source and drain of the embodiment LDNMOS. The more uniform field results in a more uniform voltage drop across the lateral diffused drain of the LDNMOS transistor resulting in a reduced peak electric field and therefore a higher diode breakdown voltage. This in turn enables the embodiment LDNMOS to switch a higher voltage and to be constructed in a smaller area.

As shown in FIG. 1C, a p-type epi layer 130 is epitaxially grown on the substrate 100, the BND 102 and the BPD 132. As illustrated in FIG. 1C, the individual BPD implanted regions such as 118 and 120 (FIG. 1B) diffuse together forming a continuous tapered BPD 132 with lighter doping near the drain end of the LDNMOS. The p-type epi layer may have a thickness of approximately 3 microns or more with a resistivity in the range of 1 to 10 ohm-cm.

In FIG. 1D an nwell photo resist pattern 140 is formed on the integrated circuit wafer and n-type dopant 144 is implanted to form nwell 146 in core logic PMOS transistor region 50 and to form lateral diffused drain region 148 in the embodiment LDNMOS transistor region 70. Resist blocking geometry 142 is formed over the body region of the LDNMOS transistor to block the n-type implant. A vertical p-type electrical connection 150 is formed to the BPD 132 in the blocked region 142. The purpose of this vertical p-type region is to prevent the BPD from electrically floating. The nwell dopant may have a concentration in the range of about 2E12 to 8E12 and may be implanted with an energy in the range of about 200 KeV to 600 KeV. An nwell anneal may be performed to activate the n-type dopant 144 and to drive the nwell 146 and lateral doped drain diffusion 148 to the desired depth.

As is illustrated in FIG. 1E, a layer of pad silicon dioxide may then be grown on the wafer and a layer of silicon nitride deposited on the pad oxide. An active photo resist pattern 160 may then be formed on the integrated circuit. Trenches for shallow trench isolation (STI) are etched through the silicon nitride and pad oxide and into the integrated circuit wafer. Alternatively, the silicon nitride and silicon dioxide may be etched and etching of the STI trenches may be omitted. Local oxidation of silicon (LOCOS) may then be grown in the etched openings.

The integrated circuit is shown in FIG. 1F after the STI trenches are etched, the STI photo resist pattern 160 is removed, the STI trenches are filled with STI dielectric 162, and the STI dielectric 162 is planarized.

In FIG. 1G a pwell photoresist pattern 164 is formed on the integrated circuit and a p-type dopant 168 is implanted to form pwell 166. Pwell 166 forms the body of the embodiment LDNMOS transistor. Pwell 166 is electrically connected to BPD diffusions 132 by the vertical p-type connection 150. The tabs 167 in FIG. 2G provide electrical connection to a top p-type diffusion that is formed over the lateral diffused drain and under the STI geometry 162 in a subsequent processing step. A pwell may optionally also be formed in the substrate 130 in the NMOS transistor region 60.

Referring now to FIG. 1H an n-channel metal-oxide-semiconductor (NMOS) transistor turn on voltage (Vtn) photo resist pattern 170 is formed on the integrated circuit and p-type dopant 178 is implanted to set the Vtn in the channel 172 of the NMOS transistor region 60 and to set the Vtn in the channel 174 of the LDNMOS transistor region 70. P-type dopant 179 is then implanted at a higher energy to form top p-type diffusion (TPD) 176 under the STI dielectric 162 in the lateral diffused drain region of the embodiment LDNMOS transistor. The p-type tabs (FIG. 2G) short the TPD to the body of the LDNOS transistor and prevent it from floating. An upper current channel 226 is formed between the TPD 176 and BPD 132 p-type diffusion. The upper current channel 226 fully depletes when the LDNMOS transistor is turned off and high voltage is applied to the drain of the LDMOS. In an example embodiment the TPD dopant 178 is boron with a concentration in the range of about $1E12/cm^2$ to $8E12/cm^2$ implanted with an energy in the range of about 50 KeV to 200 KeV.

A lower current channel 228 is formed in the BND 102 between the overlying BPD 132 and the underlying p-type substrate 100. The lower current channel 228 fully depletes when the LDNMOS transistor is turned off and high voltage is applied to the drain of the LDMOS.

In FIGS. 1I and 2I a p-channel metal-oxide-semiconductor (PMOS) transistor turn on voltage (Vtp) photo resist pattern 180 is formed on the integrated circuit and a p-type dopant 186 is implanted into the channel region 182 of the core PMOS transistor region 50 to set Vtp.

Referring now to FIGS. 1J and 2J, a transistor gate dielectric is formed on the wafer and a transistor gate material 190 such as polysilicon is deposited on the gate dielectric. A transistor gate photo resist pattern is formed on the gate material layer 190 with PMOS transistor gate resist geometry 192, with NMOS transistor gate resist geometry 194, and with LDMOS transistor gate geometries 196 and 198.

Referring now to FIGS. 1K and 2K, the gate material 190 is etched to form PMOS transistor gate 202, NMOS transistor gate 204 and LDNMOS transistor gates 206 and 208. Dielectric sidewalls 210 are then formed on the vertical sides of the transistor gates 202, 204, 206, and 208. An n-type source and drain (NSD) photo resist pattern 200 is formed on the integrated circuit and n-type dopants 212 such as phosphorus and arsenic are implanted self-aligned to the dielectric sidewalls 210 to form the source and drain diffusions 214 in the NMOS transistor region 60. The n-type dopant 212 is also implanted into the LDNMOS transistor to form the source 216 and drain 218 diffusions of the embodiment LDNMOS transistor in region 70.

A p-type source and drain (PSD) photo resist pattern 220 is formed on the integrated circuit as shown in FIG. 1L and 2L. P-type dopants 222 such as boron and $BF_2$ are implanted to form p-type source and drain diffusions 224 on core logic PMOS transistor region 50.

FIG. 1M shows the integrated circuit with the PSD photo resist pattern 220 removed. Additional processing steps such as source and drain anneal silicide formation, contact plug formation, and interconnect formation may then be performed using conventional methods to complete the embodiment LDNMOS integrated circuit.

Figure 3A:
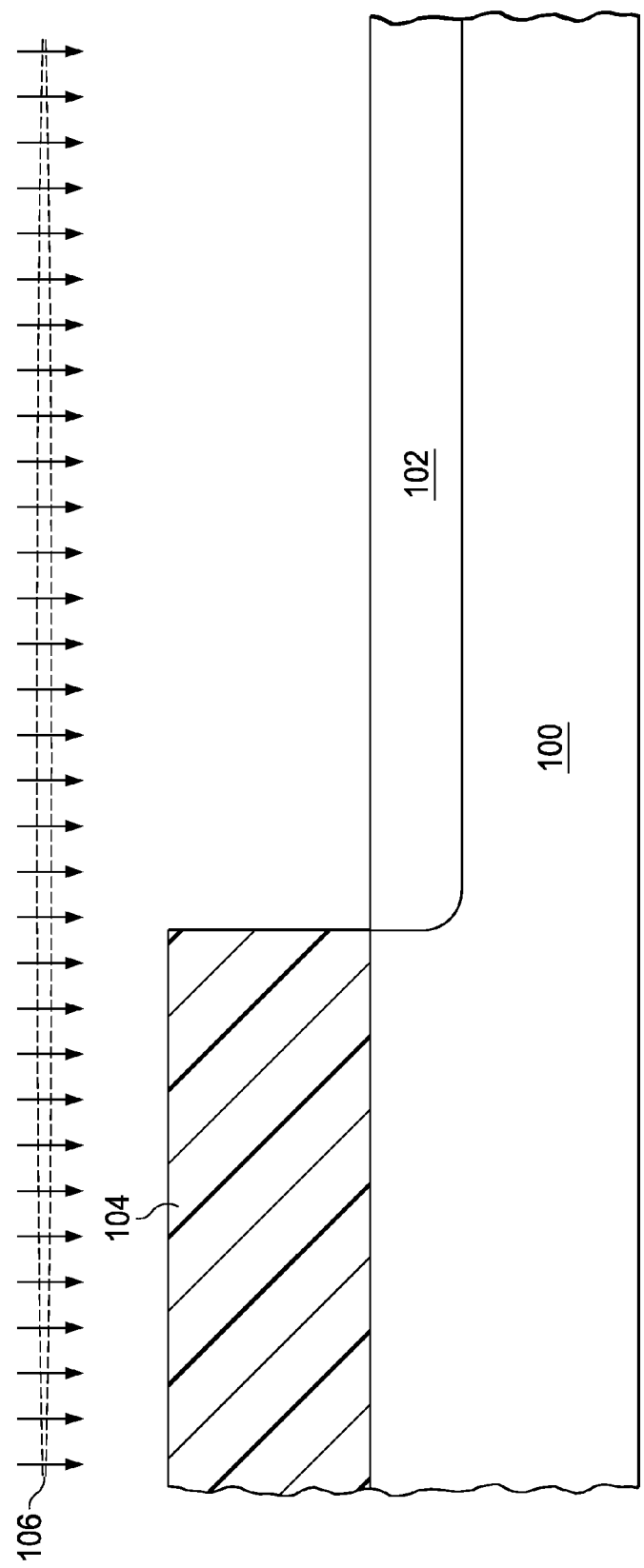
FIGS. 3A-3H are cross section illustrations of steps in the fabrication of integrated circuits formed according to principles of the invention.
Figure 3B:
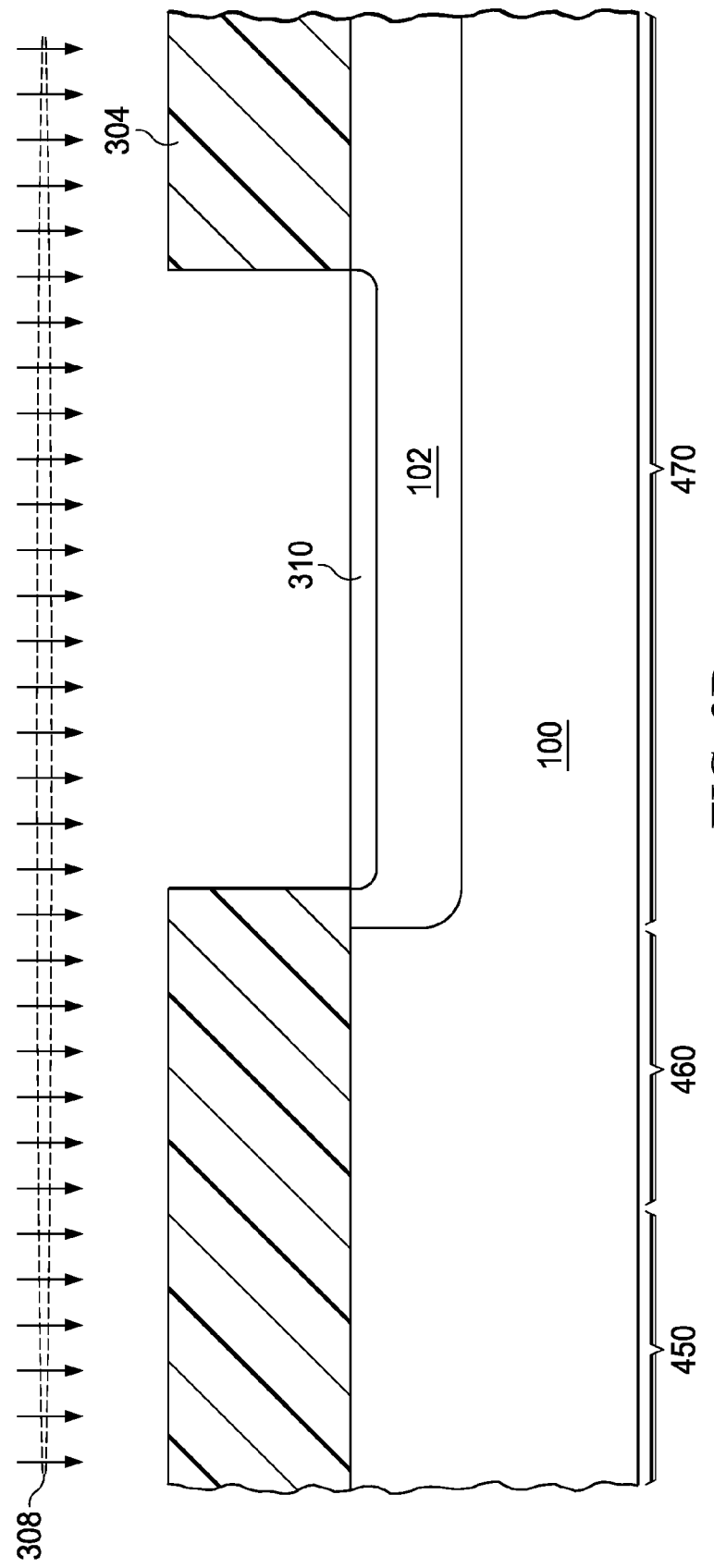
Figure 3C:
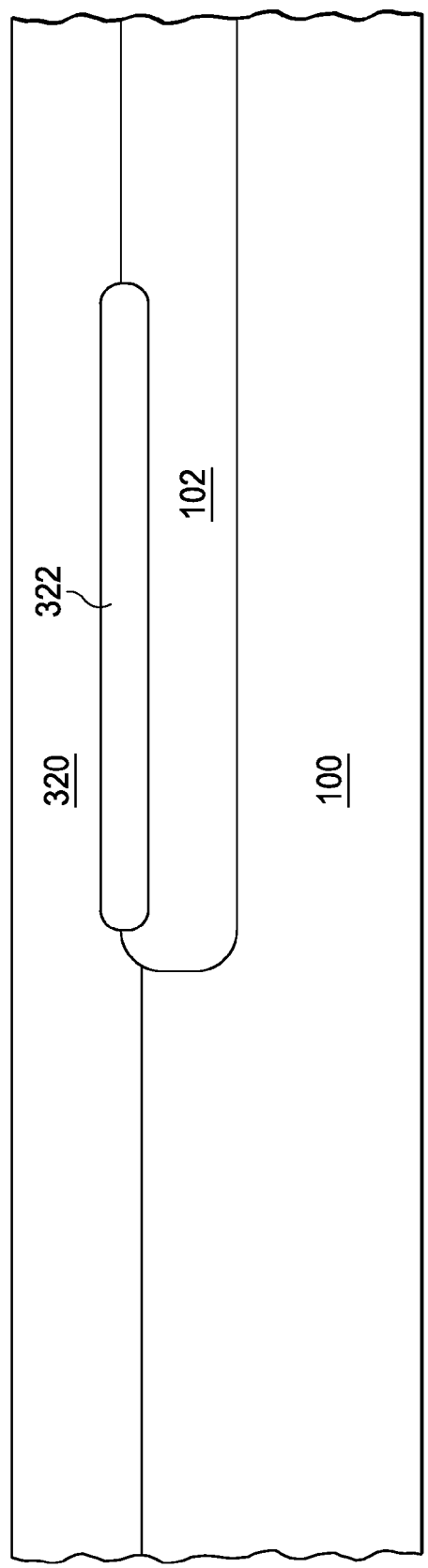
Figure 3D:
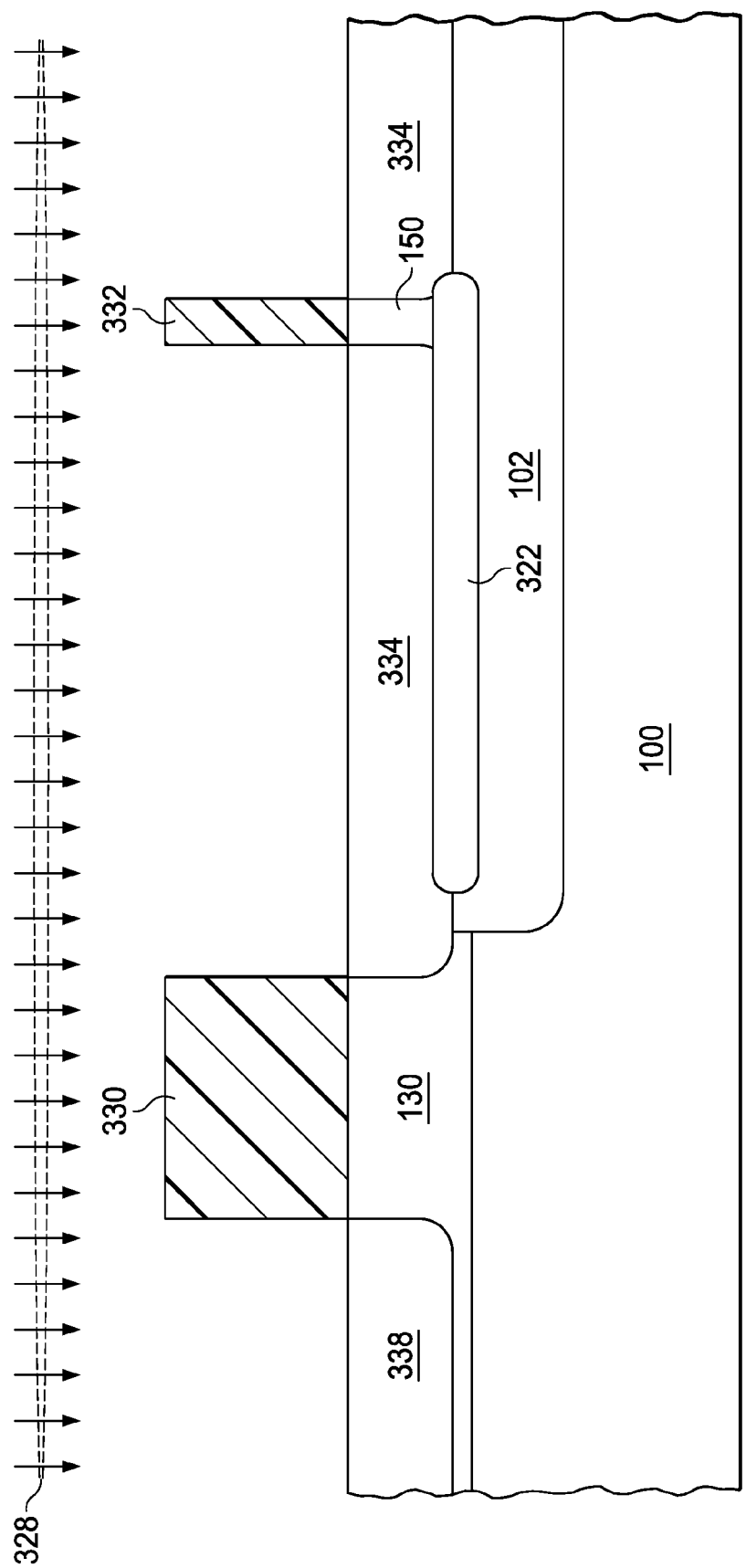
Figure 3E:
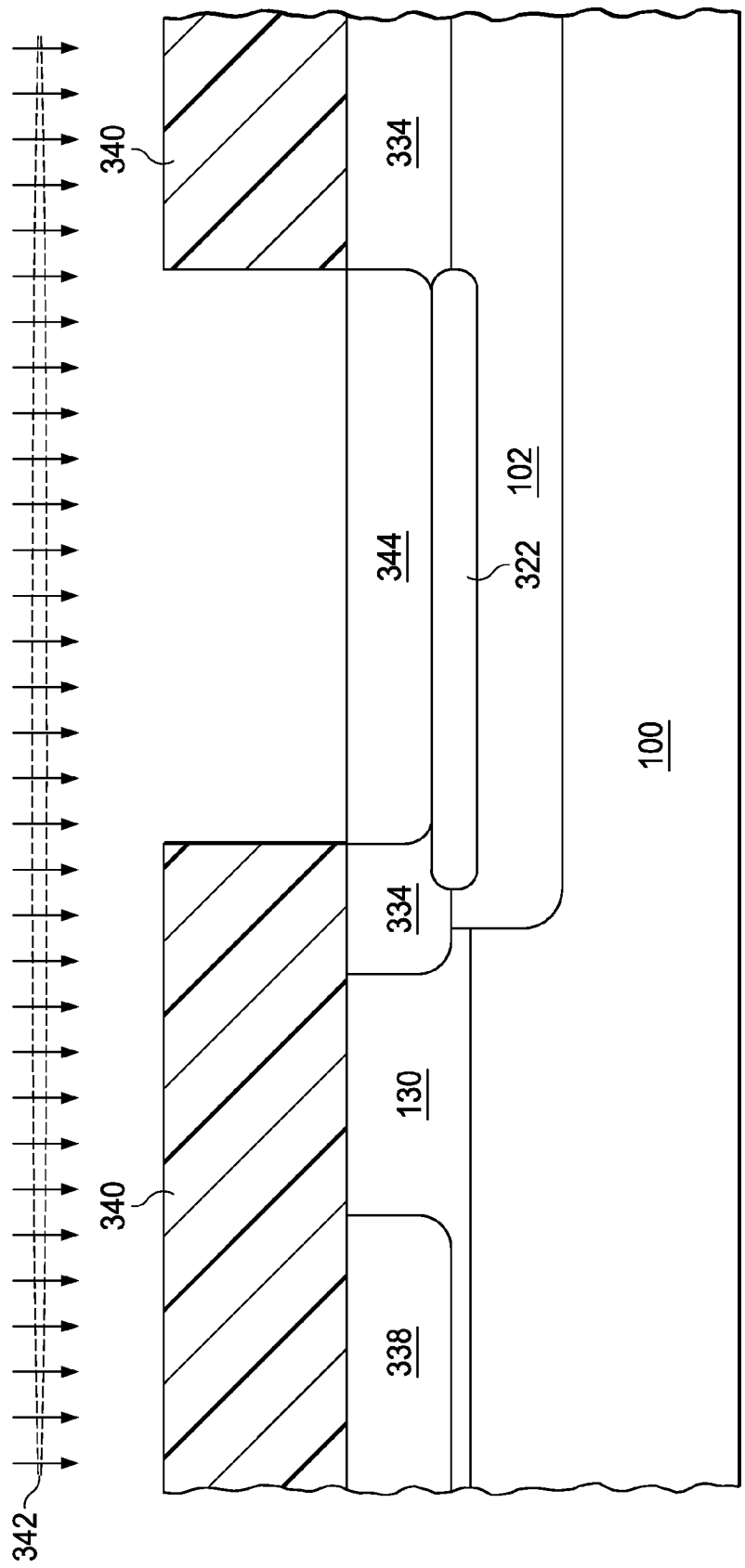
Figure 3F:
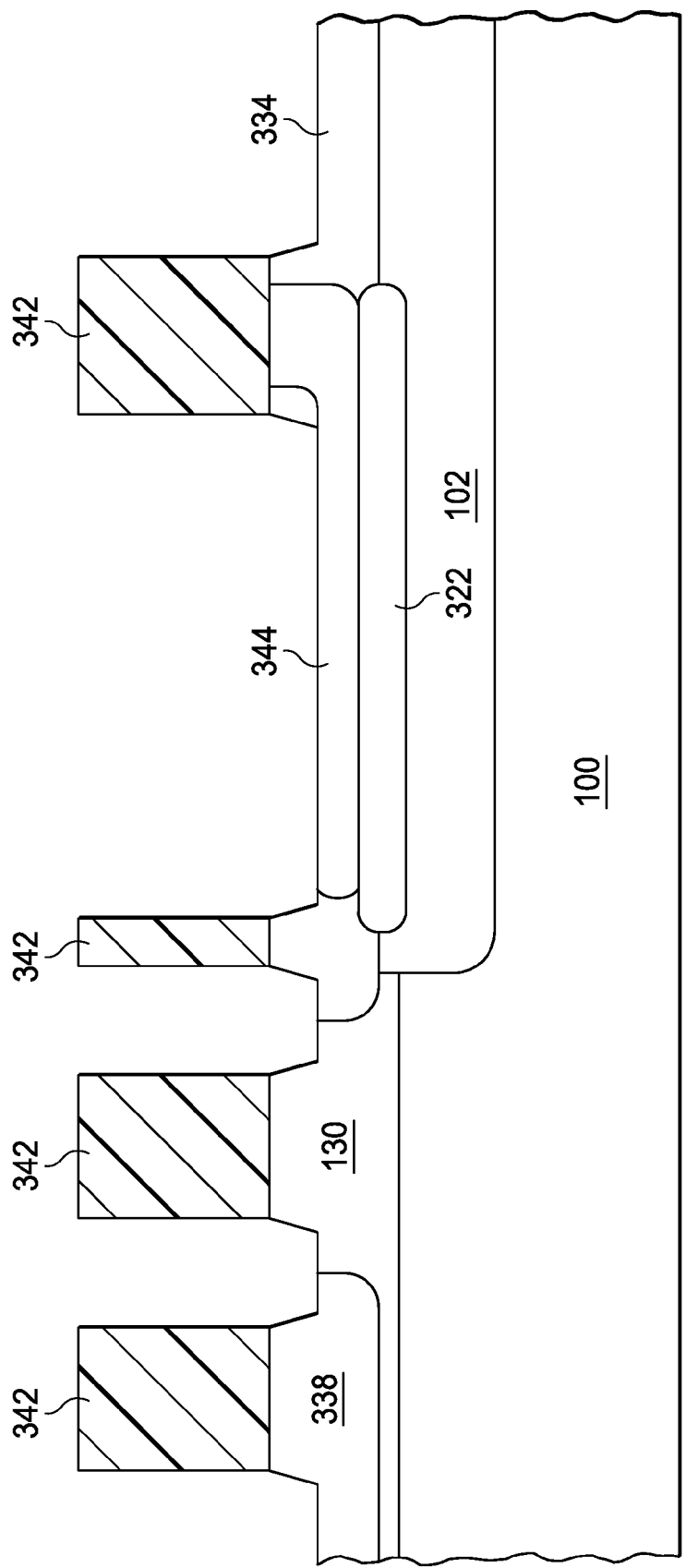
Figure 3G:
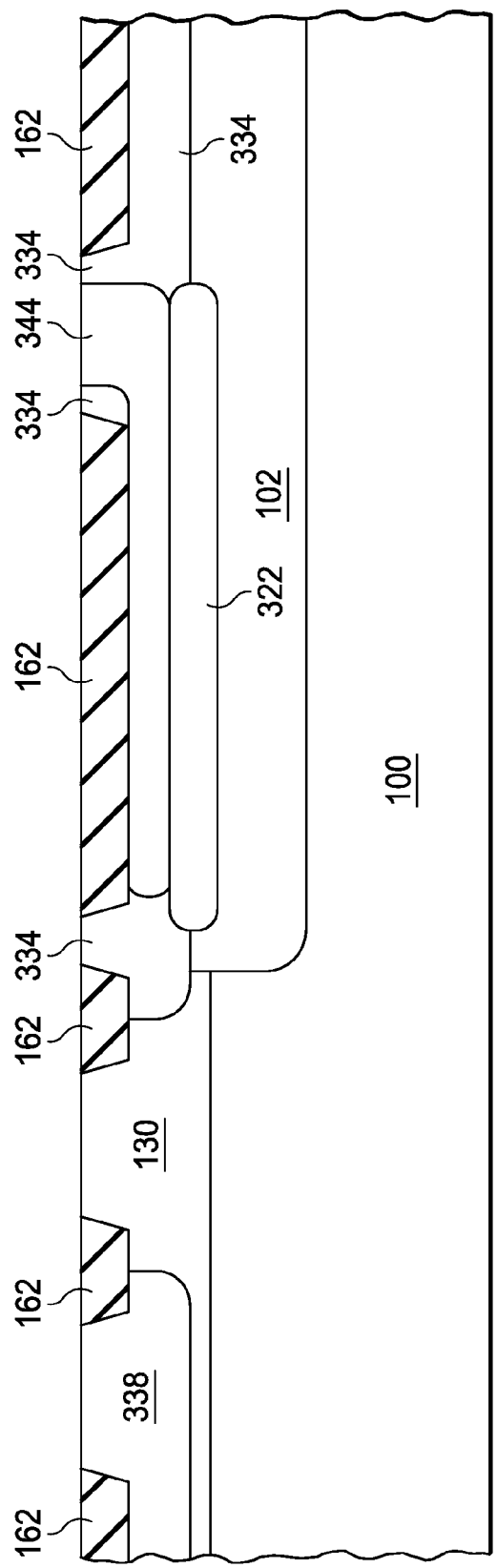
Figure 3H:
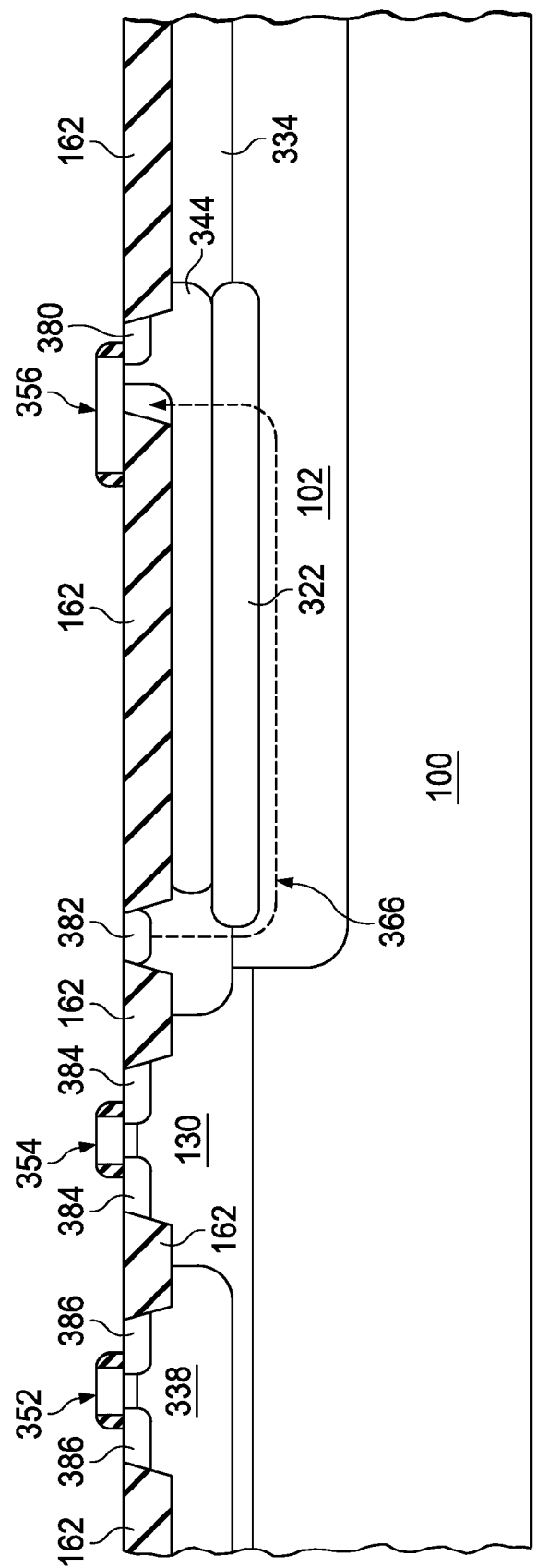
Figure 4A:
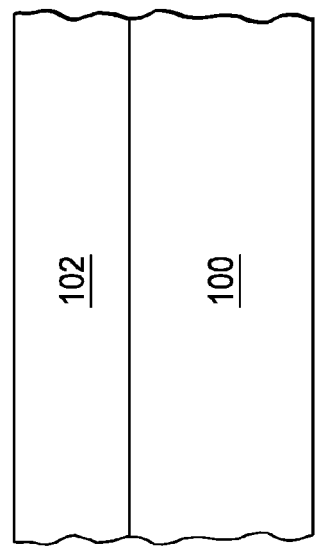
Figure 5A:
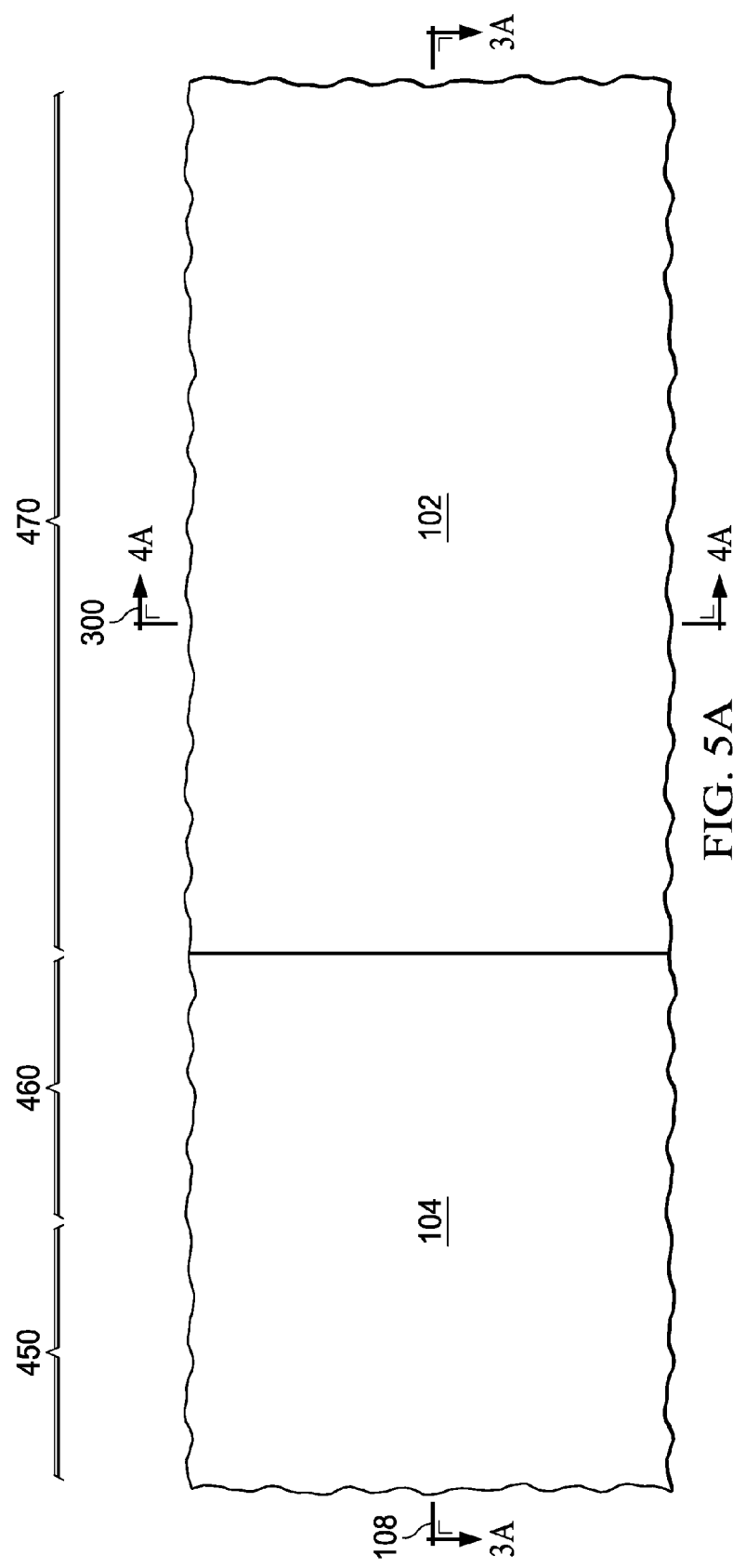
FIGS. 5A-5H are top down illustrations of steps in the fabrication of integrated circuits formed according to principles of the invention.
Figure 5B:
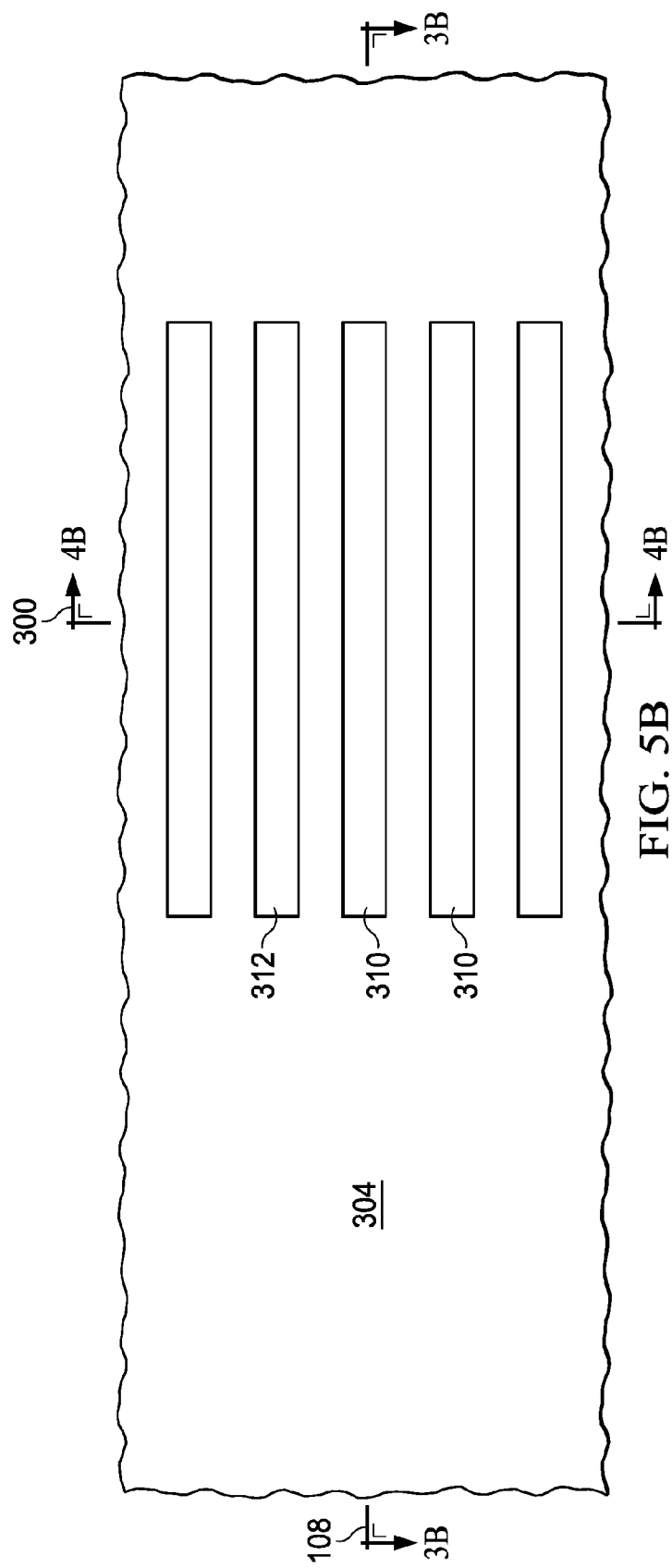
Figure 5C:
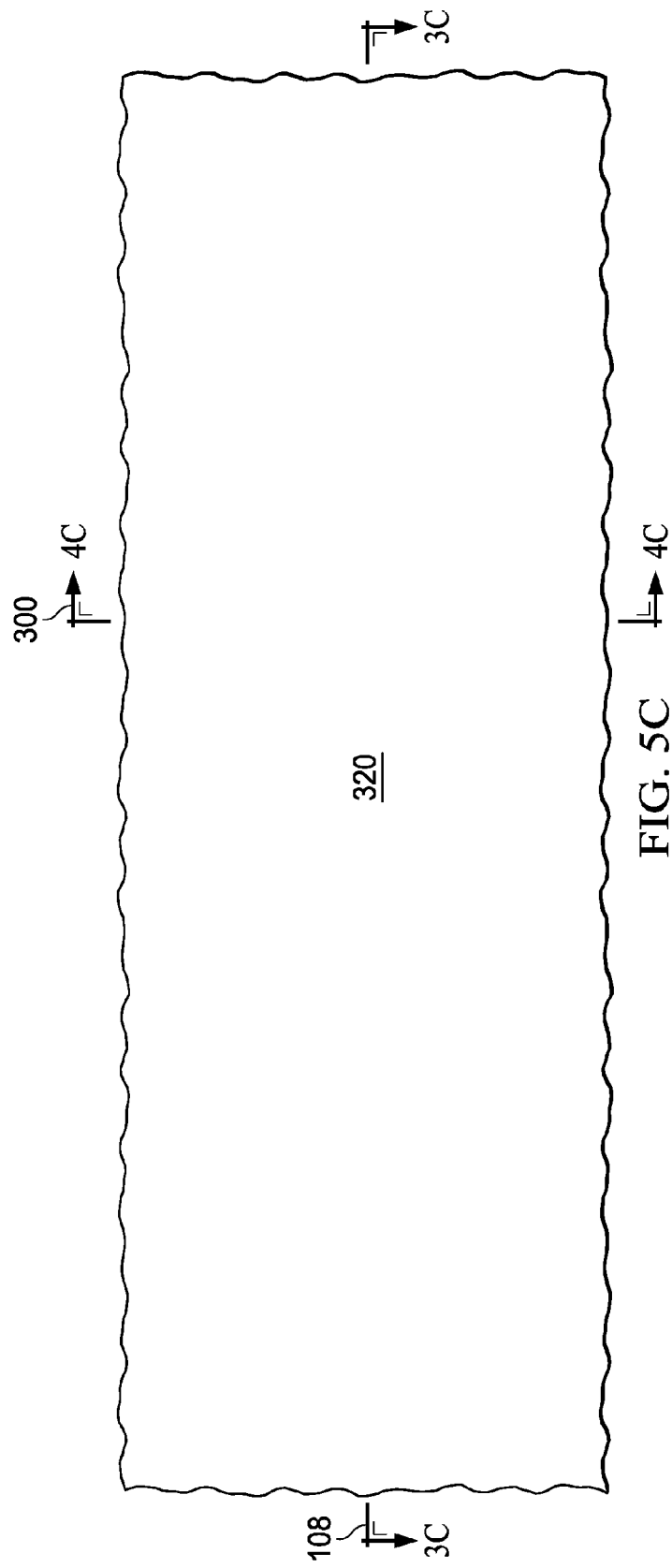
Figure 5D:
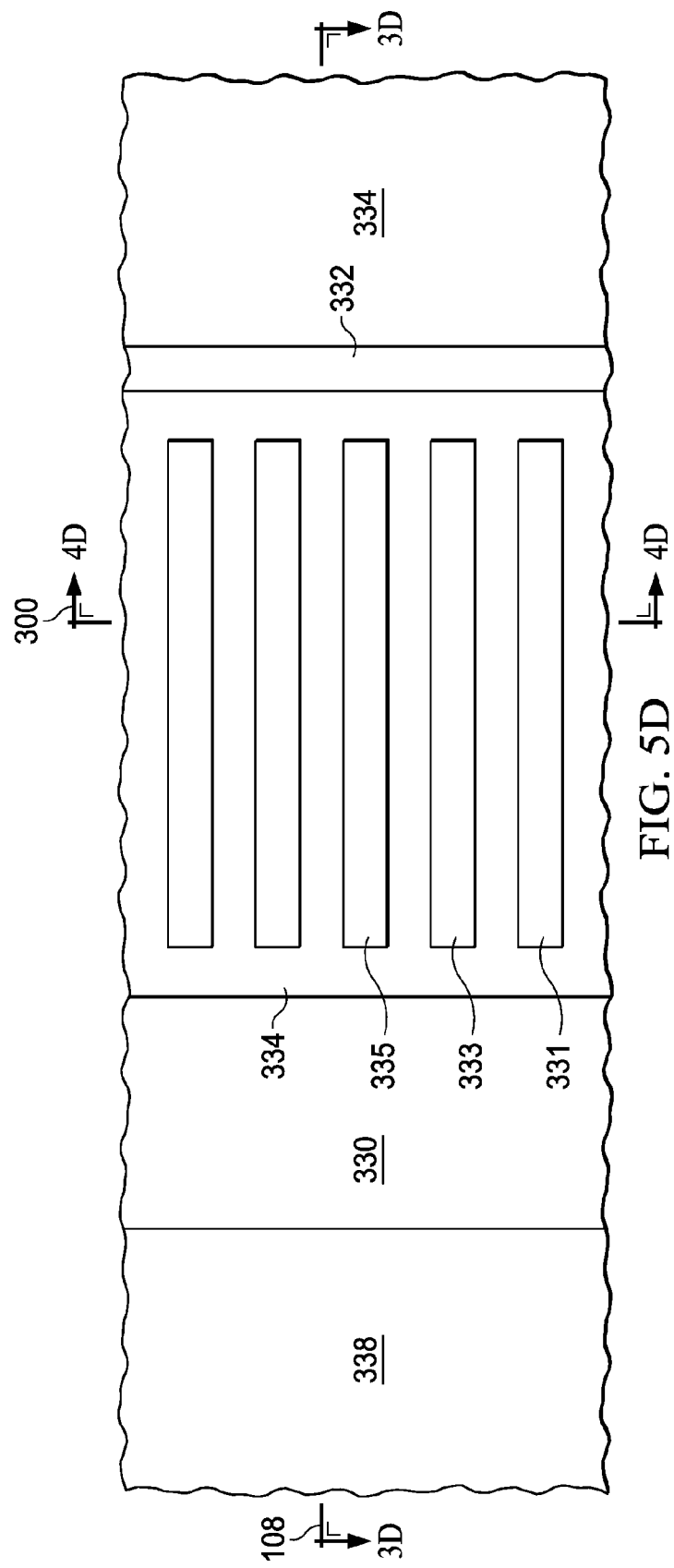
Figure 5E:
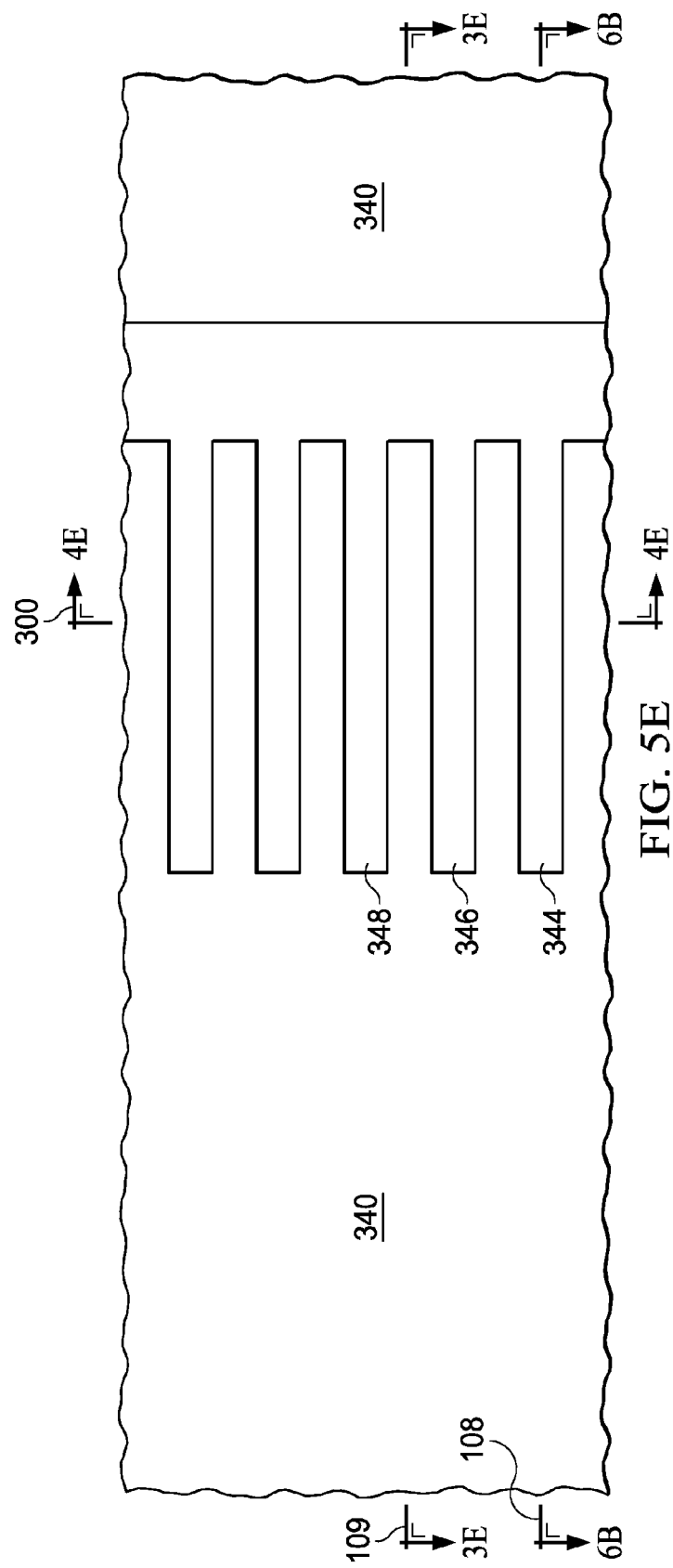
Figure 5F:
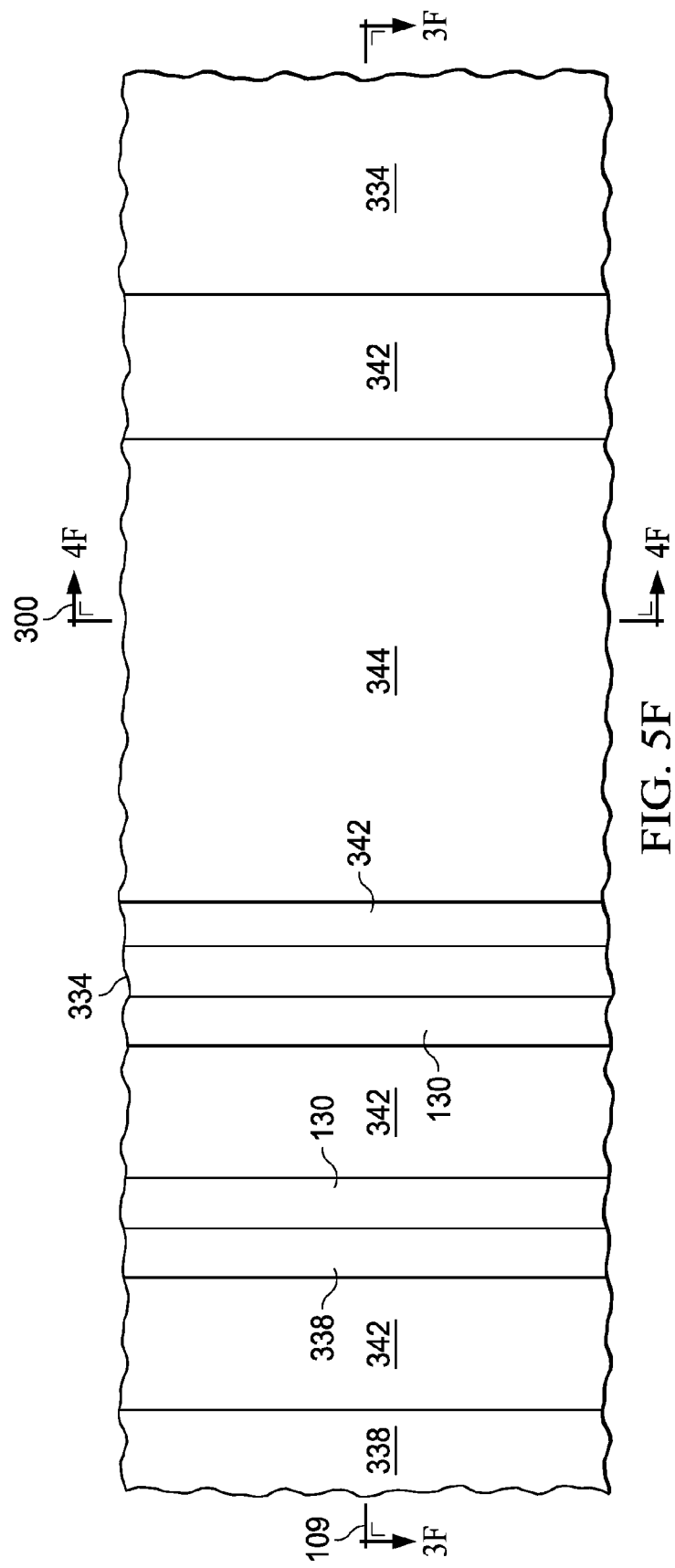
Figure 5G:
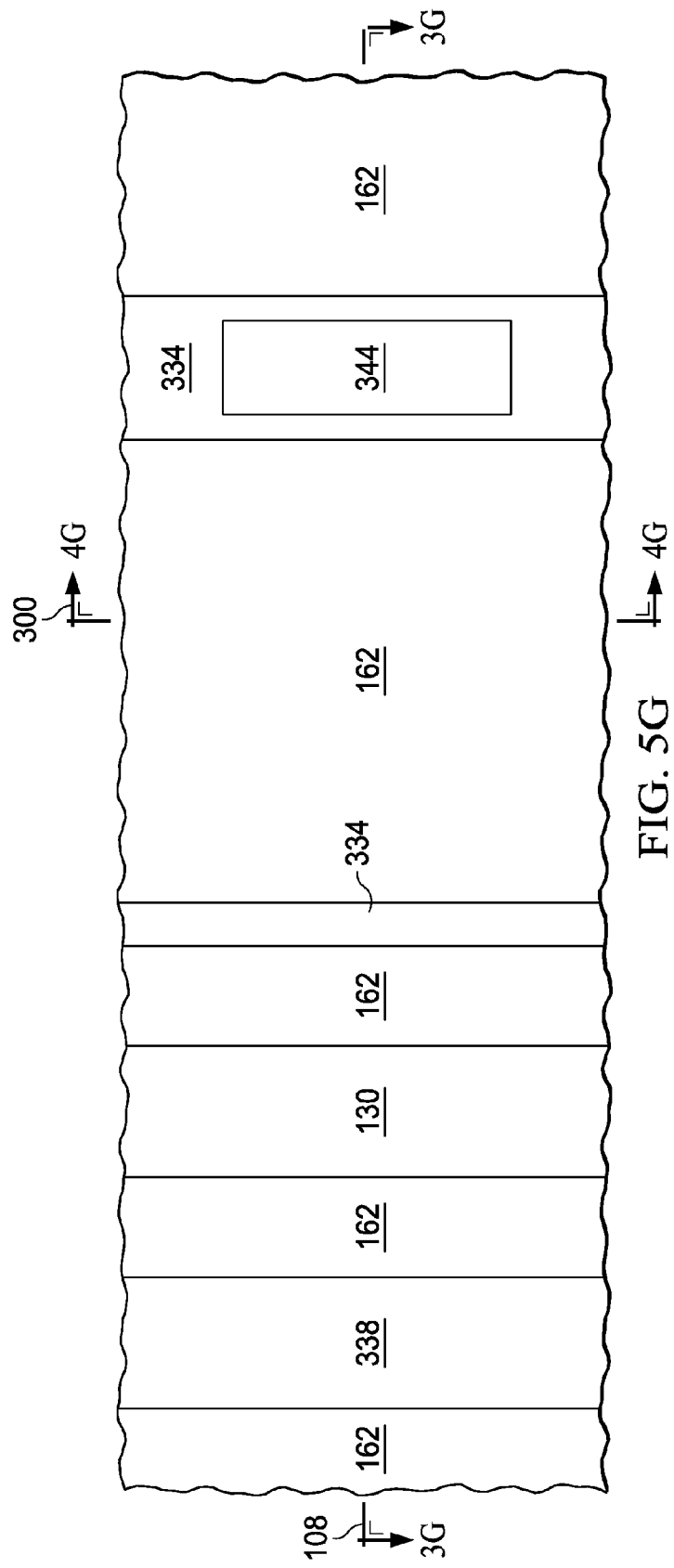
Figure 5H:
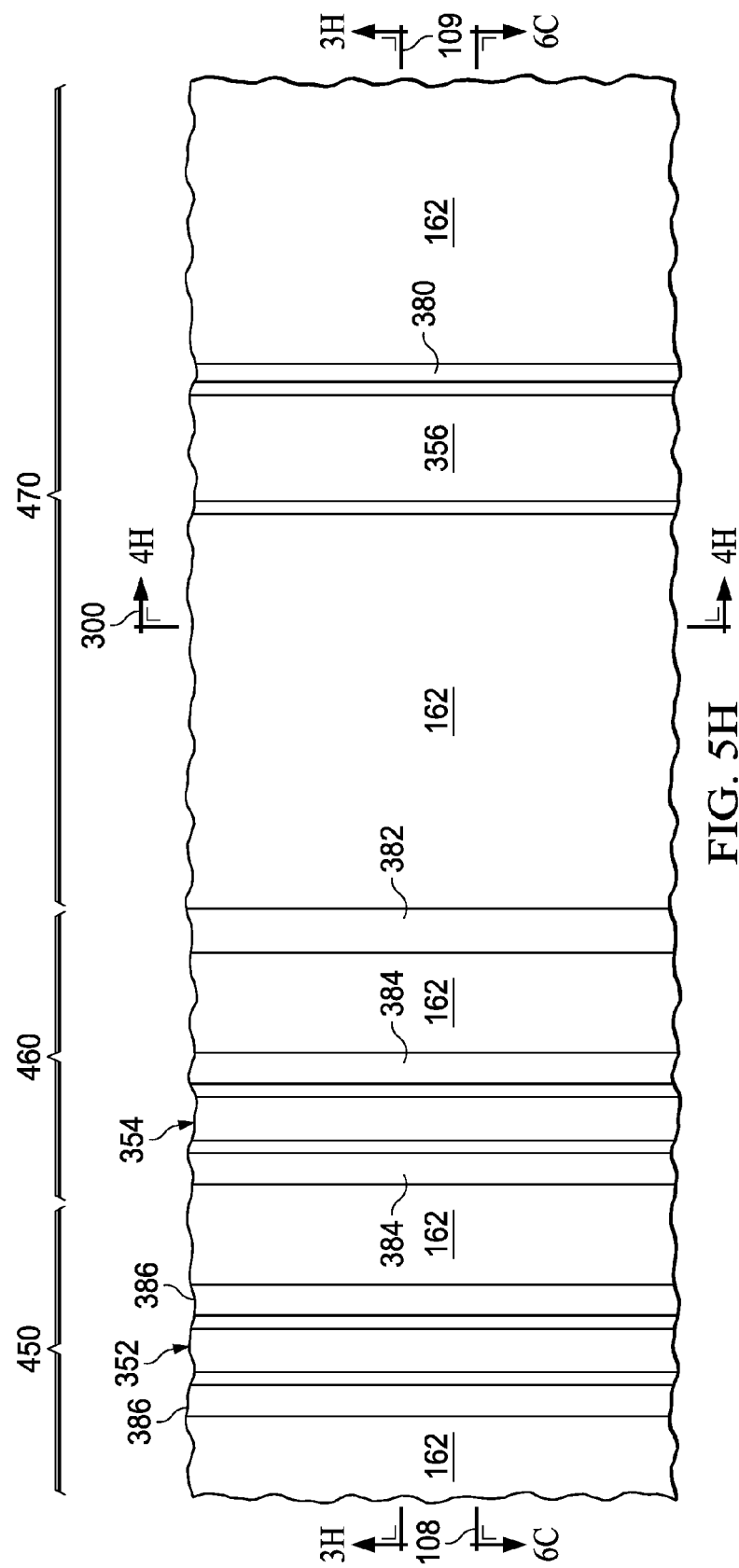
Figure 6B:
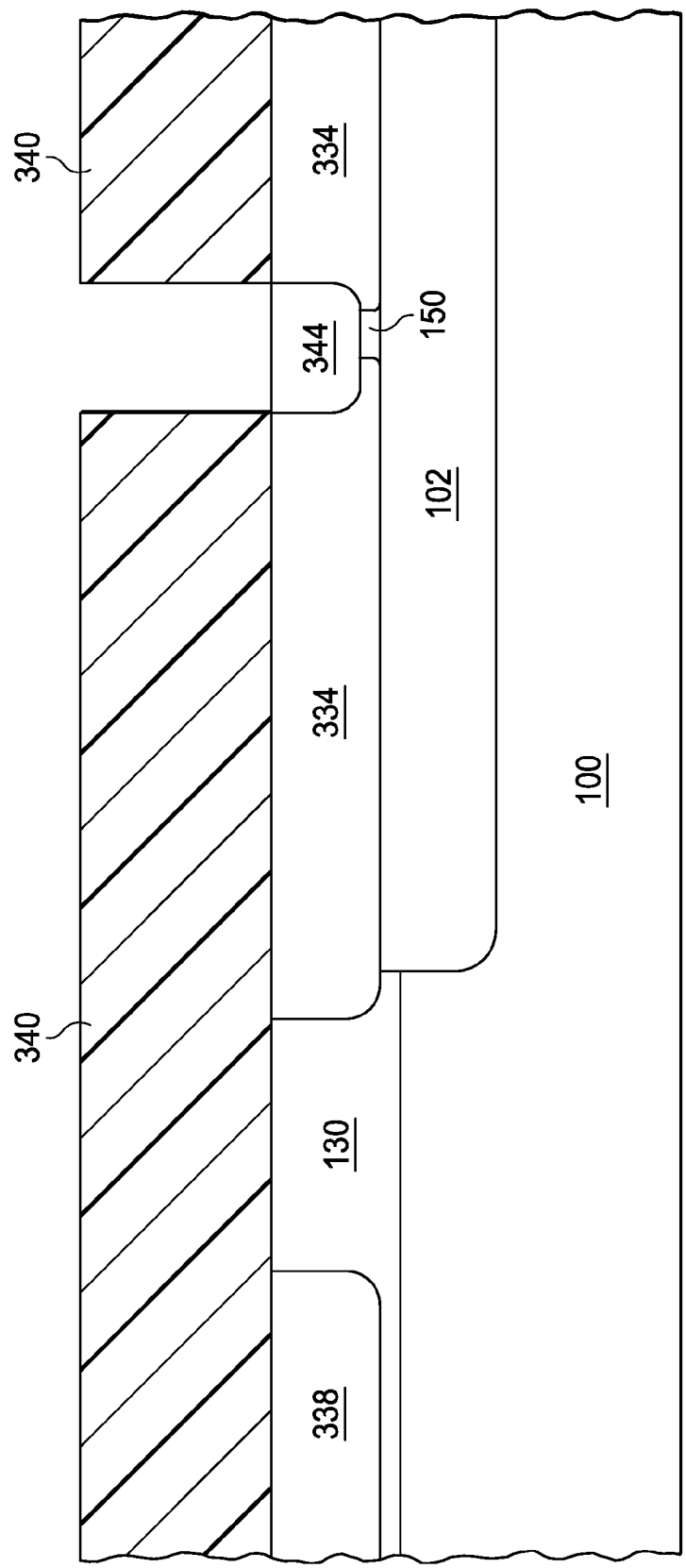
Figure 6C:
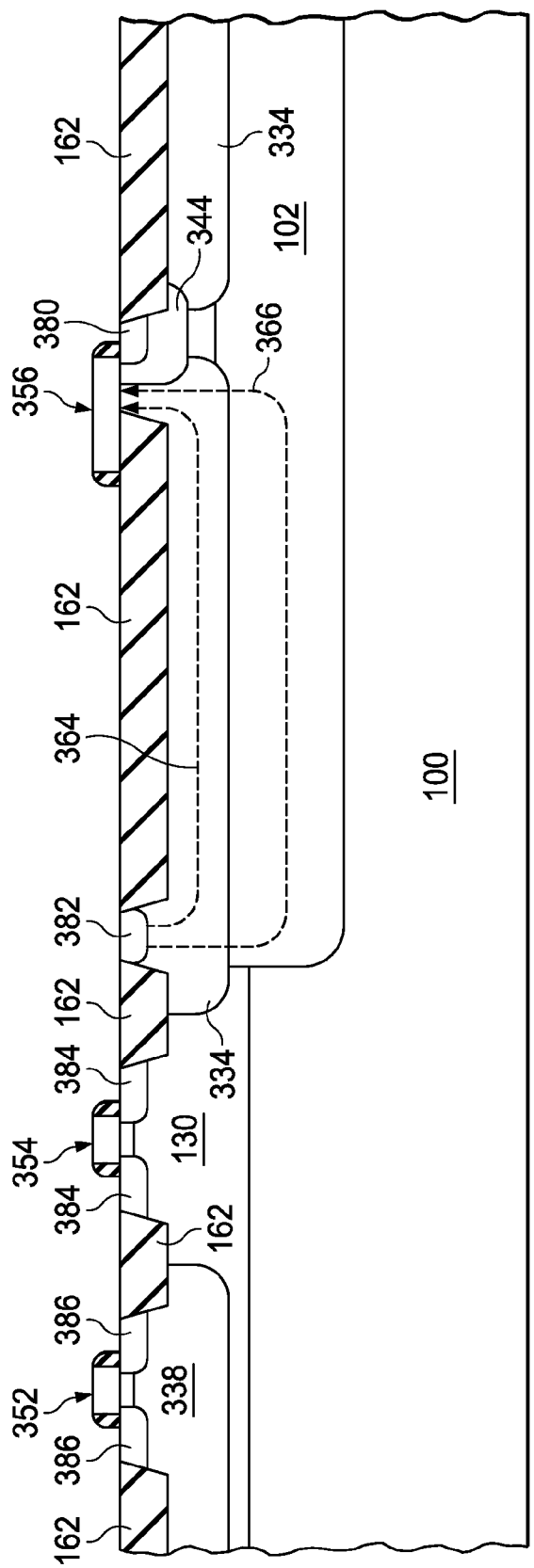
Figure 7:
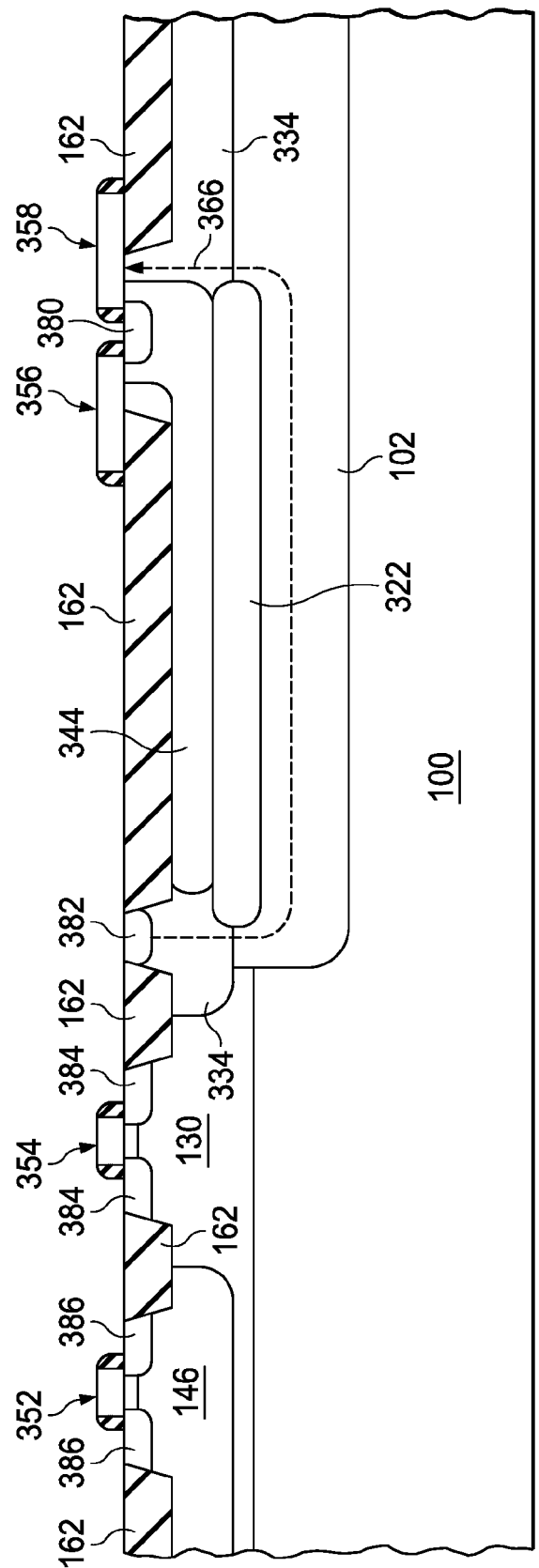
FIGS. 7, 8, and 10 are cross section illustrations of an integrated circuit formed according to principles of the invention.
Figure 8:
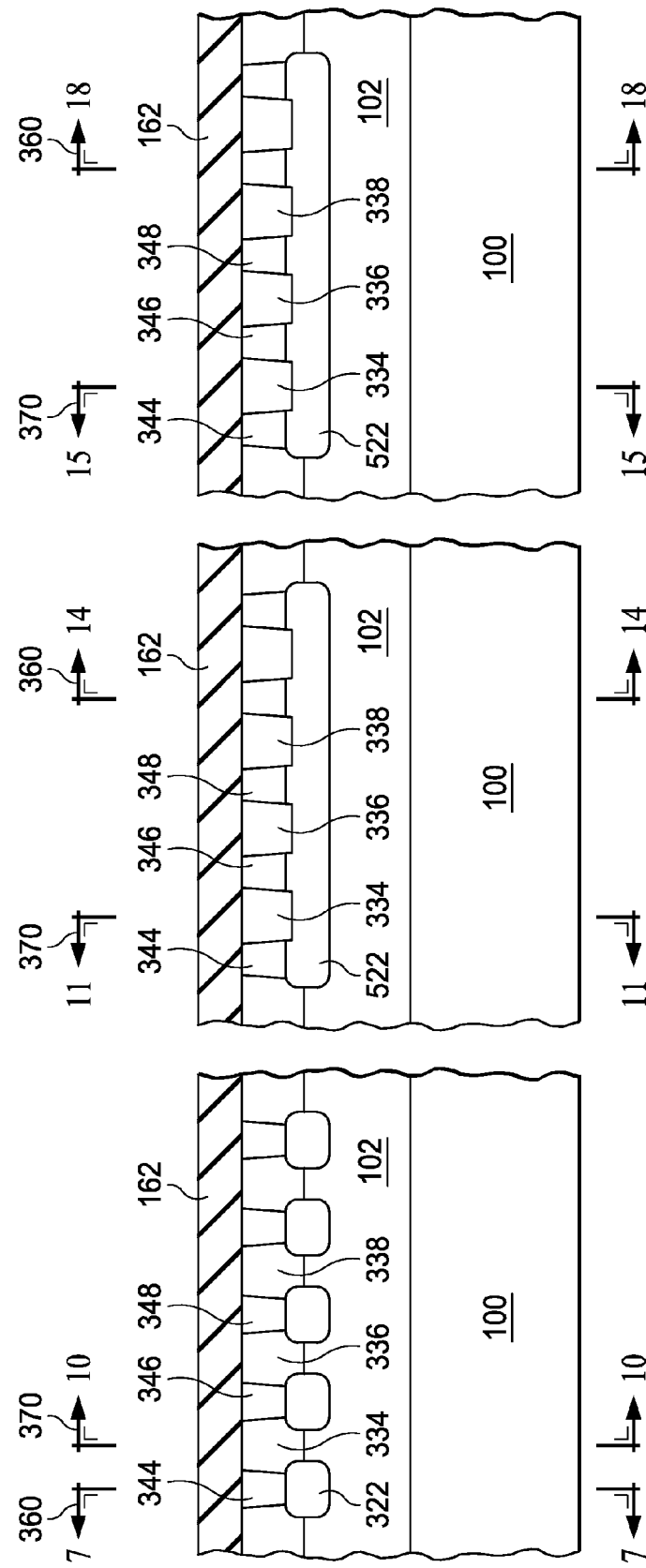
Figure 9:
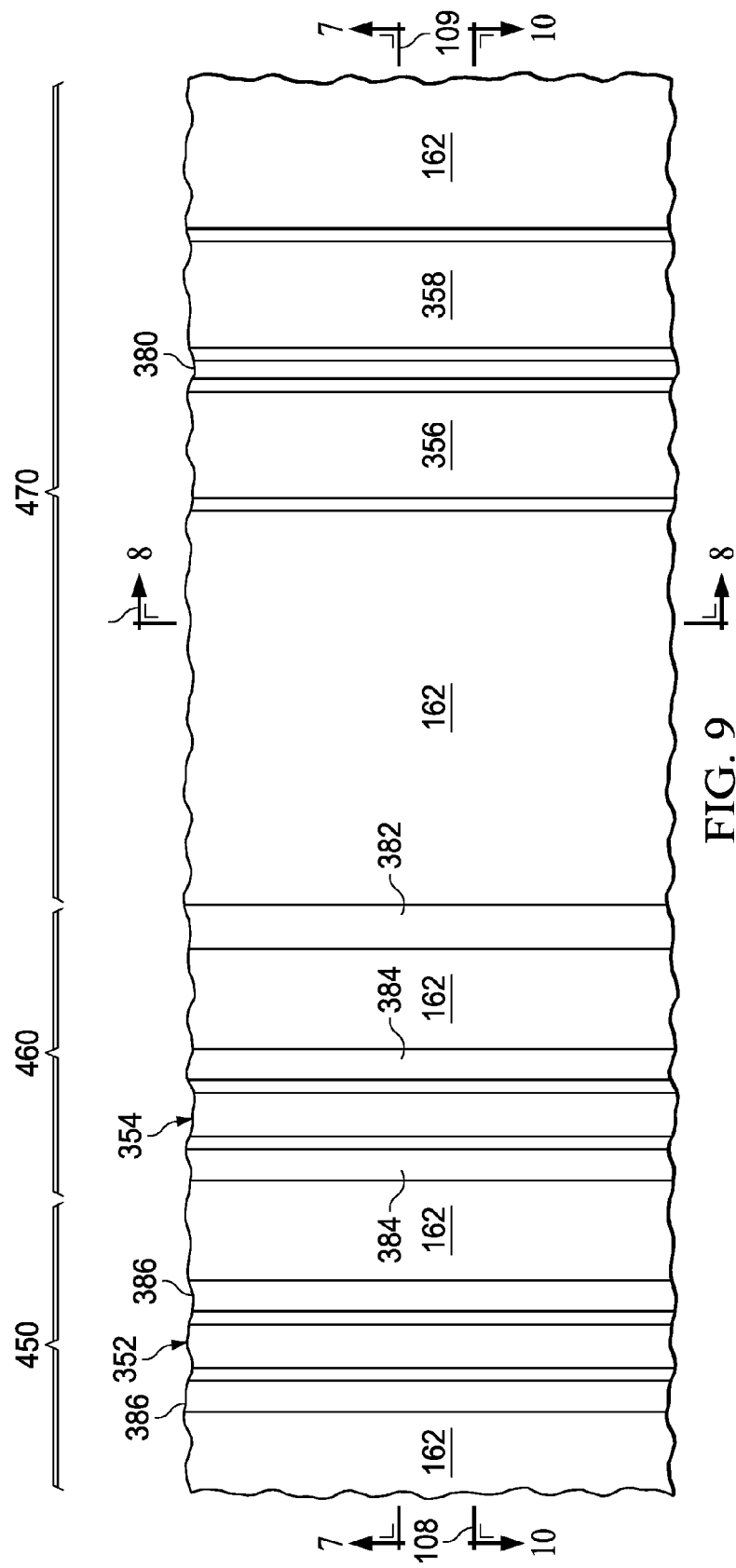
FIG. 9 is a top down view of the integrated circuit whose cross sections are illustrated in FIGS. 7, 8, and 10.

A second example integrated circuit with an embodiment LDNMOS transistor with multiple vertical current channels in addition to a horizontal channel is illustrated in cross sectional views in FIGS. 6C, 3H, and 4H and in top down view in FIG. 5H. Dashed line 364 in FIG. 6C indicates current flow through one of the vertical channels (334, 336, 338 in FIG. 4H) from drain 382 to source 380 in embodiment LDNMOS transistor formed in region 470. Dashed line 366 in FIG. 3H indicates current flow through the horizontal channel from drain 382 to source 380 in embodiment LDNMOS transistor. This embodiment LDMOS transistor provides multiple vertical (FIG. 4H) current channels (e.g. 334, 336, 338) from drain 382 to source 380 thus increasing the current density enabling the embodiment LDNMOS transistor to occupy a small area while still meeting current requirements. Each current path (e.g. 334) flows through an n-type current channel, 334, 336, 336, that lies between p-type diffusions (e.g. 344, 346, and 348). When the LDNMOS transistor is turned off and voltage is applied to the LDNMOS drain 382, the current channels (334, 336, 338) fully deplete. Sufficient voltage is dropped across these depletion regions so that the same low voltage gate dielectric that is used for transistor regions 450 and 460 may be used for the LDNMOS transistor formed in region 470.

The major manufacturing steps to form the embodiment LDNMOS transistor with multiple vertical current channels plus a horizontal channel are illustrated in cross sections in FIG. 3A-3H and FIG. 4A-4H and in top down views in FIGS. 5A-5H. The cross section view in FIG. 3A is along cut line 108 in the top down view in FIG. 5A. The cross section view in FIG. 4A is along cut line 300 in the top down view in FIG. 5A. A core logic PMOS transistor is formed in region 450, a core logic NMOS transistor is formed in region 460, and an embodiment LDNMOS transistor is formed in region 470.

In FIG. 3A and FIG. 4A a buried n-type diffusion (BND) photoresist pattern 104 is formed on a p-type substrate 100. N-type dopant 106 is implanted to form the BND diffusion 102. The BND implant may be phosphorus with a doping concentration in the range of about $3E12/cm^2$ to $8E12/cm^2$ implant with an energy in the range of about 500 KeV to 3000 KeV. A BND anneal may be performed to activate the n-type dopant and to drive the BND to a desired depth.

Figure 4B:
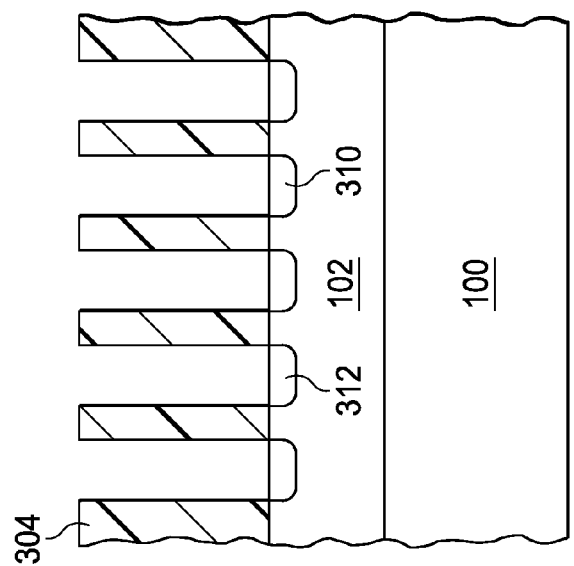

In FIGS. 3B and 4B and FIG. 5B a buried p-type diffusion (BPD) photoresist pattern 304 is formed on the integrated circuit wafer. In a first example shown in illustration FIG. 4B a plurality of openings in the BDP photo resist pattern are used to form a plurality of BPD diffusions between the source and drain of the LDNMOS transistor. Alternatively in a second example shown in illustration FIG. 6A a single BDP diffusion may be formed. The first example illustrated in FIG. 4B and top down view in FIG. 5B is used to illustrate this embodiment.

P-type dopant 308 is implanted to form the BPD area 310 contained within the BND 102. The p-type dopant may be boron with a concentration in the range of about $3E12/cm^2$ to $1E13/cm^2$ implanted with an energy in the range of about 50 KeV to 300 KeV. The BPD 310 is formed between the underlying horizontal current channel and the overlying multiple vertical current channels.

Figure 4C:
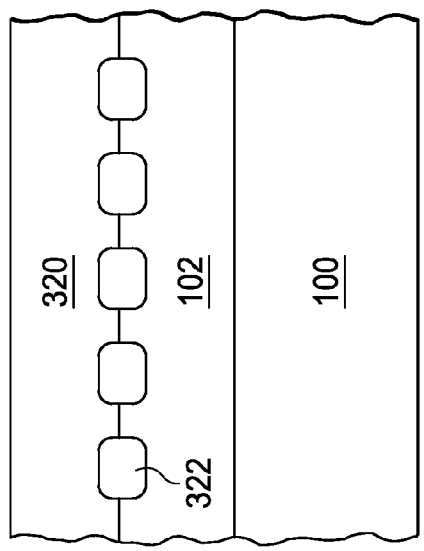

A p-type epi layer 320 is grown on the substrate 100, on the BND 102 and on the BPD 310 as shown in FIGS. 3C and 4C. BPD dopant diffuses upward as the p-type epi layer is grown forming BPD 322. The p-type epi layer 320 may be approximately 3 microns thick or more with a resistivity in the range of 1 to 10 ohm-cm.

In FIGS. 3D, 4D and FIG. 5D an nwell photo resist pattern 330 is formed on the integrated circuit wafer and n-type dopant 328 is implanted to form nwell 338 in the core logic PMOS transistor region 450 and to form the lateral diffused drain region 334 of the embodiment LDNMOS transistor. Resist stripes 331, 333, 335 (FIG. 5D) block the nwell dopant 328 forming multiple stripes of nwell, 334, 336, and 338 (FIG. 4D) between the source and drain of the LDNMOS transistor which form the multiple current channels. Resist geometry 332 blocks the n-type implant in the body area of the LDNMOS transistor forming vertical p-type electrical connection 150 to the BPD diffusions 322. The nwell dopant may have a concentration in the range of about 2E12 to 8E12 implanted with an energy in the range of about 200 KeV to 600 KeV. An nwell anneal may be performed to activate then-type dopant 328 and to drive the nwells 338 and 334 to the desired depth.

Referring now to FIGS. 3E, 4E, 3E, and 5E a pwell photo resist pattern 340 is formed on the integrated circuit and p-type dopant such as boron or BF2 is implanted to form the p-type body 344 of the LDNMOS transistor. Optionally a pwell may also be formed in the NMOS transistor region 460.

As shown in the top down view in FIG. 5E, pwell finger diffusions, 344, 346, and 348 are formed between the multiple current channels 334, 336, and 338 (FIG. 3E-R) in the extended drain region of the LDNMOS transistor. When high voltage is applied to the drain of the LDNMOS transistor the current channels, 334, 336, and 338 between the pwell finger diffusions 344, 346, and 348 completely deplete. Sufficient voltage is dropped across these depletion regions to protect the low voltage gate dielectric on the gate of the LDNMOS transistor.

The cross section in FIG. 6B is along cut line 109 in FIG. 5E. This cross section is through one of the n-type current channels 334. The cross section in FIG. 3E is along cut line 108 in FIG. 5E. This cross section is through one of the pwell fingers 344.

An active photo resist pattern 342 may then be formed on the integrated circuit as shown in FIGS. 3, 4F and 5F. Shallow trench isolation trenches are etched into the substrate of the integrated circuit wafer.

The integrated circuit is shown in FIG. 3G and 4G after the STI trenches are etched, the STI photo resist pattern 342 is removed, the STI trenches are filled with STI dielectric 162, and planarized using chemical mechanical polish (CMP).

Gate dielectric and a PMOS transistor gate 352, an NMOS transistor gate 354, and a LDNMOS transistor gate 356 are then formed on the integrated circuit as indicated in FIGS. 3H and 4H. A top down view is shown in FIG. 5H.

Process steps illustrated previously in FIGS. 1K and 1L form the source and drain diffusions 384 in the NMOS transistor region 460, the source 380 and drain 382 diffusions on the LDNMOS transistor formed in region 470, and the source and drain diffusions 386 in the PMOS transistor region 450 as are shown in FIGS. 3H, 4H, and 6C. The cross section in FIG. 6C is along cut line 109 in FIG. 5H and along cut line 370 in FIG. 4H. This cut line is from source to drain of the LDNMOS transistor through one of the current channels 334.

The cross section in FIG. 3H is along cut line 108 in FIG. 5H and along cutline 360 in FIG. 4H. This cut line is from source to drain on the LDNMOS transistor through one of the p-type diffusions 344 that lies between the current channels 334.

As is illustrated in FIG. 4H, multiple vertical current channels, 334, 346, and 348 are formed from source 380 to drain 382 of the embodiment LDNMOS transistor formed in region 470. Current flows in parallel from drain 382 to source 380 through each of these vertical channels, 334, 336, 338 as is indicated by the dashed line 364 in cross section in FIG. 6C. The cross section in FIG. 6C is through one of these vertical channels.

Current also flows through a horizontal current channel lying under the BND 102 as indicated by the dashed line 366 in the section 6C. The multiple vertical current paths plus the horizontal current path enable the embodiment LDNMOS transistor to occupy a small area and still conduct high current.

Figure 10:
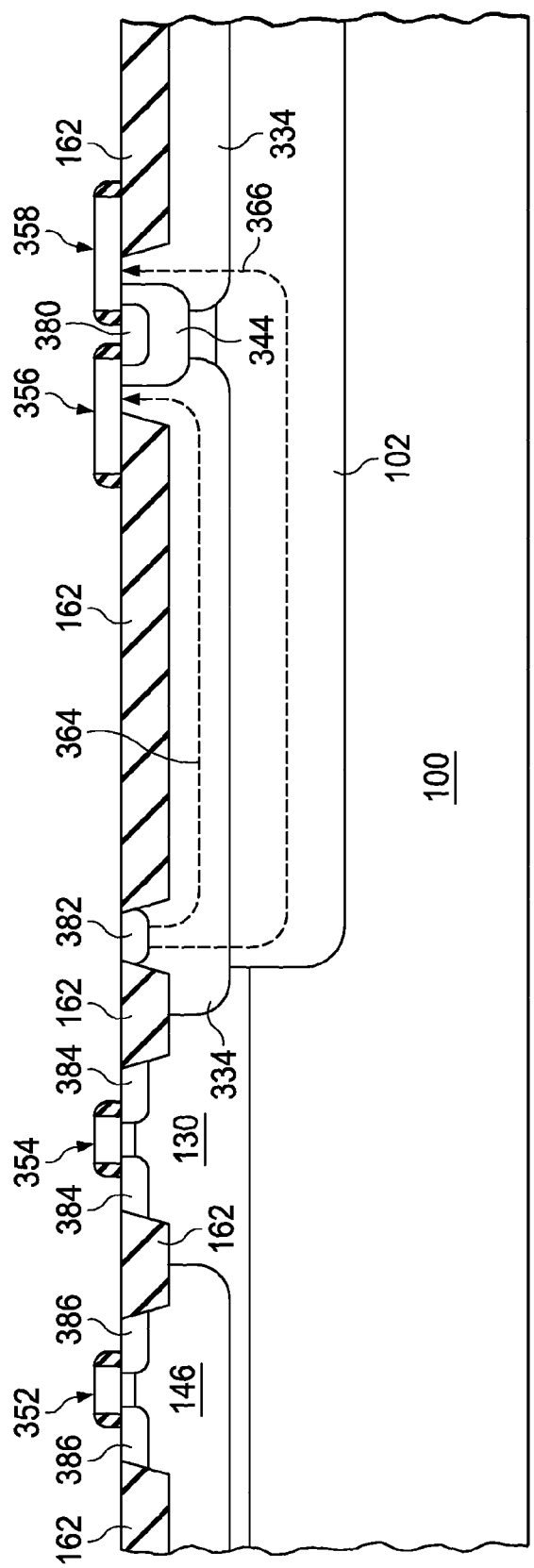

FIGS. 3A-3H illustrate multiple vertical channel embodiment LDNMOS transistors with one LDNMOS transistor gate 356. As is illustrated in FIGS. 7, 8, 9, and 10, a dual multiple vertical channel embodiment LDNMOS transistor with two transistor gates 356 and 358 is an alternative way to build the embodiment LDNMOS transistor. As is illustrated in FIG. 10 when the first LDNMOS transistor gate 356 turns on current flows through the multiple vertical current paths 334, 336, and 338 from drain to source and current also flows through the horizontal current channel in BND 102. When the second LDNMOS transistor gate 358 turns on, additional current flows from drain to source through horizontal current channel in BND 102. By adding a second LDNMOS transistor gate 358 and forming a dual gate LDNMOS transistor the current carrying capability of the LDNMOS may be significantly increased with just a small increase in area.

Figure 13:
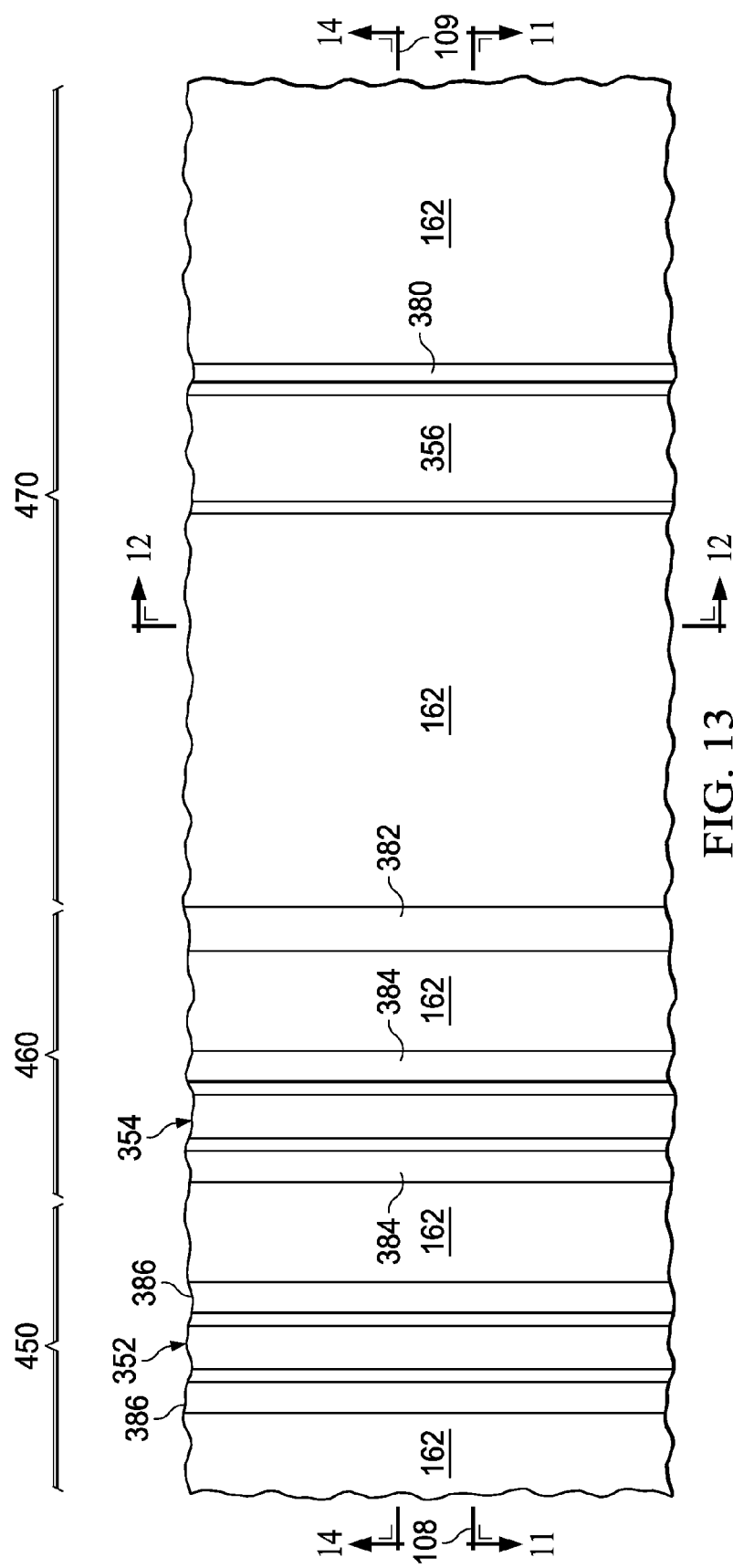
FIG. 13 is a top down view of the integrated circuit whose cross sections are illustrated in FIGS. 11, 12, and 14.
Figure 14:
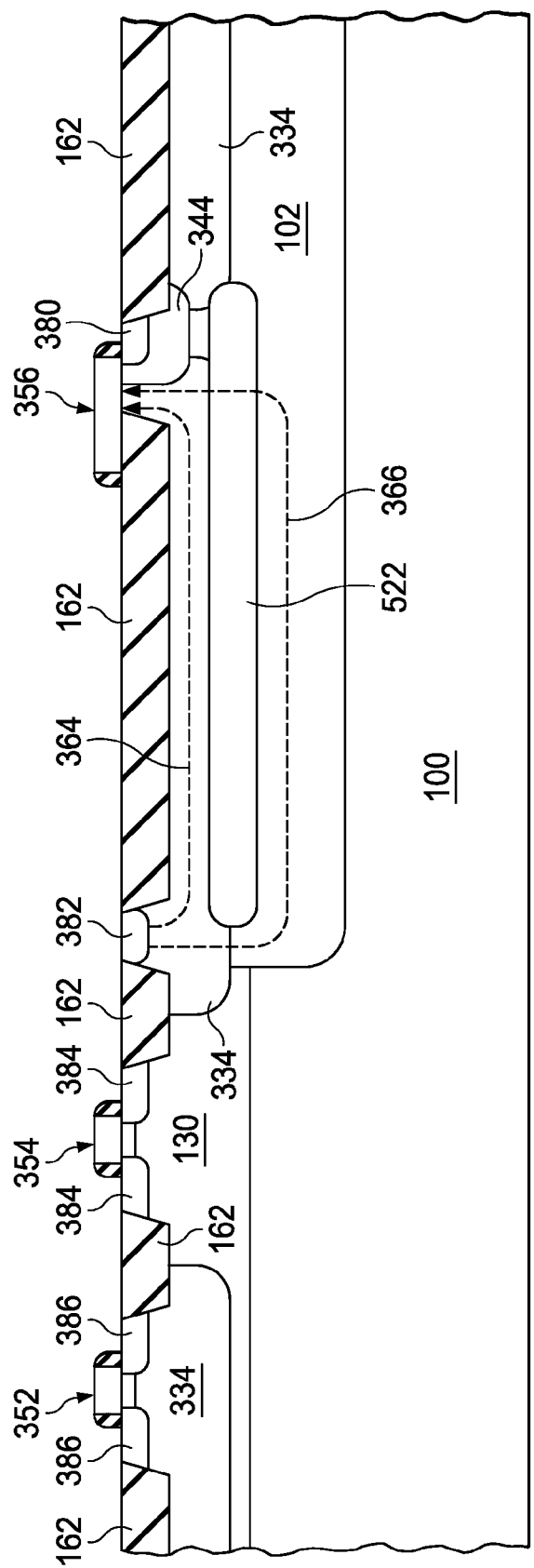
Figure 15:
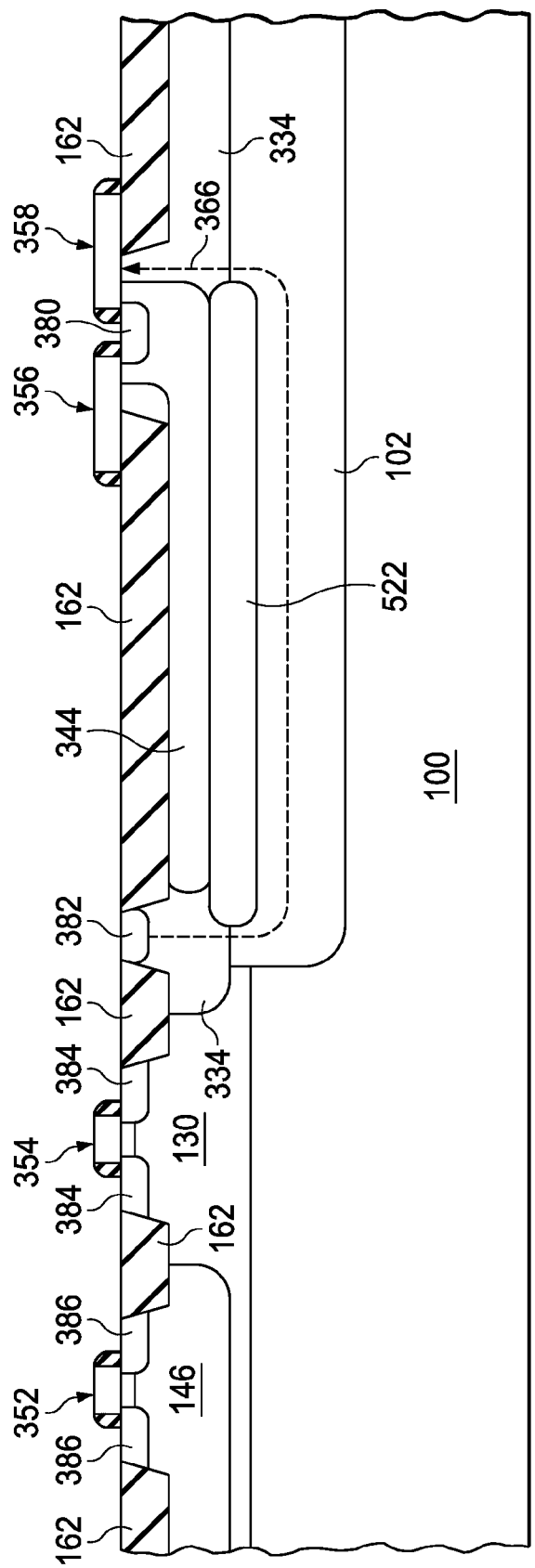
Figure 17:
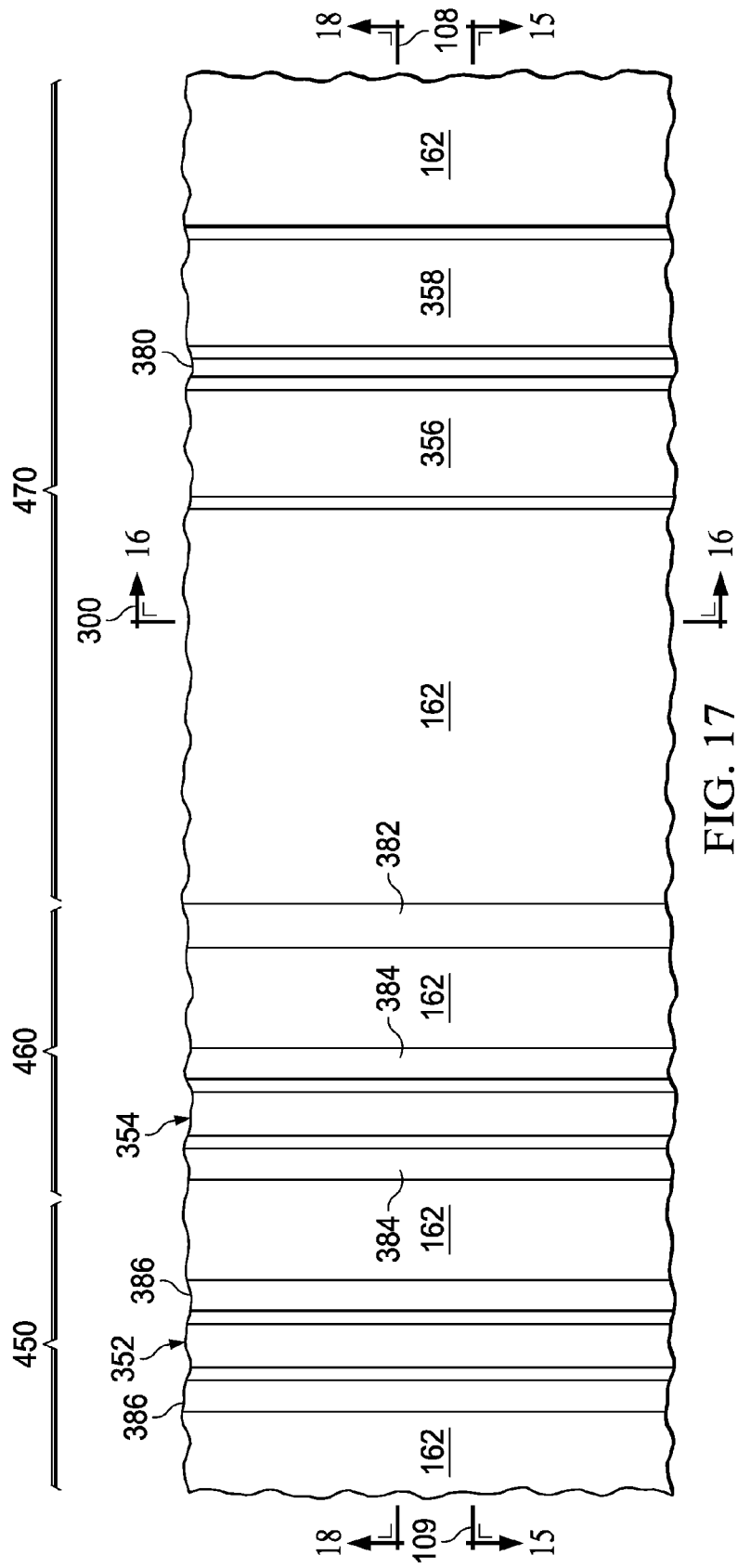
FIG. 17 is a top down view of the integrated circuit whose cross sections are illustrated in FIGS. 15, 16, and 18.
Figure 18:
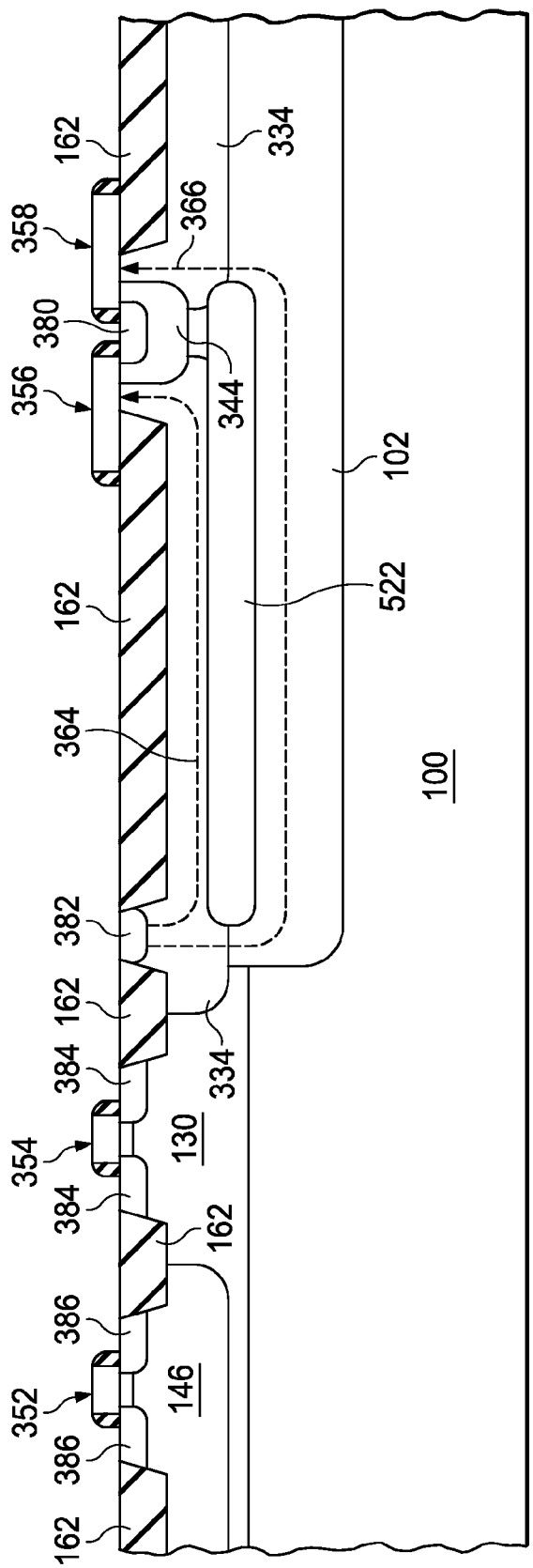

An embodiment multiple vertical channel single gate LDNMOS transistor with a single BPD 522 is illustrated in FIGS. 11, 12, 13, and 14. Cross section in FIG. 14 is taken through conduction channel 338 along cutline 370 in FIG. 12 and along cut line 109 in FIG. 13. Unlike the previous embodiment shown in FIG. 8, the BPD 522 underlies the vertical current conduction channels 334, 336, and 338.

Figure 11:
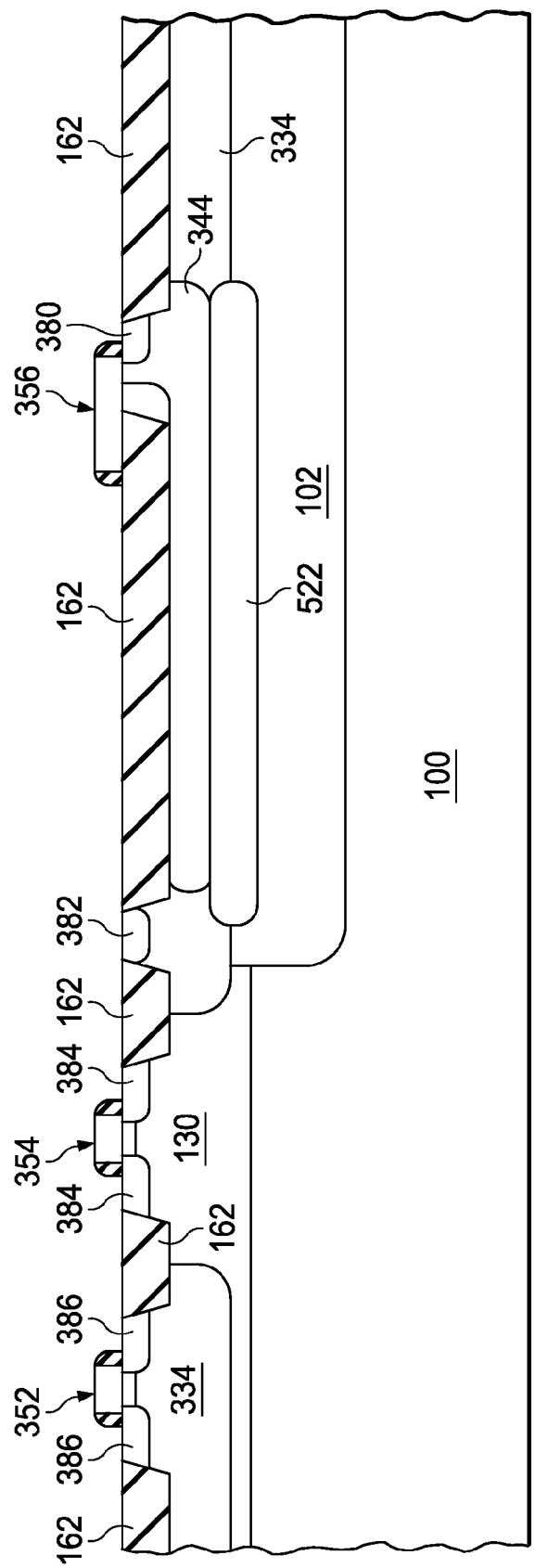

The cross section in FIG. 11 is taken through pwell diffusion 344 along cutline 360 in FIG. 12 and along cut line 108 in FIG. 13.

Current flows from drain to source through each of the vertical channels, 334, 336, and 338 as is indicated by the dashed line 364 in the cross section in FIG. 14. Current also flows through the horizontal current channel in BND 102 under the BPD 522 as indicated by the dashed line 366 in the cross section 14. The multiple current paths enable the embodiment LDNMOS transistor to occupy a small area and still conduct high current.

A dual gate, 356 and 358, LDNMOS transistor formed in region 470 with multiple vertical channels, and a single BPD 522 is illustrated in FIGS. 15, 16, 17, and 18. With a small increase in area significantly more current may be carried from the drain 382 to source 380 through the channel of the second LDMOS transistor 358 and the horizontal current channel in BND 102.

Those skilled in the art to which this invention relates will appreciate that many other embodiments and variations are possible within the scope of the claimed invention. For example, the above embodiments are illustrated using embodiment LDNMOS transistors. Those skilled in the art may readily adapt the embodiments to LDPMOS transistors.

What is claimed is:

1. A process of forming an integrated circuit containing an LDNMOS transistor with multiple vertical current channels and a horizontal current channel, comprising the steps:
   forming a buried n-type buried diffusion on a p-type substrate;
   forming a p-type buried diffusion contained in the n-type buried diffusion;
   forming a plurality of vertical n-type extended drain diffusions over the p-type buried diffusion and between a LDNMOS transistor gate and the LDNMOS drain;
   implanting pwell dopant to form the body of the LDNMOS and to form a plurality of vertical pwell finger diffusions between the vertical n-type extended drain diffusions;
   implanting p-type dopant at low energy into the channel of an NMOS transistor to set a turn on voltage of the NMOS transistor and into a channel of the LDNMOS transistor to set a turn on voltage; forming an NMOS transistor gate, a PMOS transistor gate, and the LDNMOS transistor gate;
   forming dielectric sidewalls on the NMOS transistor gate, the PMOS transistor gate, and the LDNMOS transistor gate;
   forming source and drain diffusions of the NMOS transistor self-aligned to the dielectric sidewalls on the NMOS transistor gate; and forming an LDNMOS source self-aligned to the dielectric sidewalls on the LDNMOS transistor gate and forming an LDNMOS drain wherein the plurality of vertical n-type extended drain diffusions form a plurality of vertical LDNMOS channels between the source and the drain and wherein a horizontal LDMOS channel is formed between the LDNMOS source and LDNMOS drain in the buried n-type diffusion which lies under the buried p-type diffusion and over the p-type substrate.

2. The process of claim 1 further comprising:

during the step of forming the buried p-type diffusion forming a plurality of buried p-type diffusions wherein plurality of buried p-type diffusions underlie the plurality of vertical pwell finger diffusions.

3. The process of claim 1, wherein the buried n-type dopant is phosphorus with a concentration in the range of about $3E12/cm^2$ to $8E12/cm^2$ that is implanted with energy in the range of about 500 KeV to 3000 KeV;

the buried p-type dopant is boron with a concentration in the range of about $4E12/cm^2$ to $1E13/cm^2$ that is implanted with an energy in the range of about 50 KeV to 300 KeV;

the n-type vertical extended drain dopant is phosphorus with a concentration in the range of about $2E12/cm^2$ to $8E12/cm^2$ that is implanted with energy in the range of about 200 KeV to 600 KeV; and the pwell dopant is boron with a concentration in the range of about $1E13/cm^2$ to $2E14/cm^2$ that is implanted with an energy in the range of about 50 KeV to 200 KeV.

4. A process of forming an integrated circuit containing an LDNMOS transistor with multiple vertical current channels and a horizontal current channel, comprising the steps:

forming a buried n-type buried diffusion on a p-type substrate;

forming a p-type buried diffusion contained in the n-type buried diffusion;

forming a plurality of vertical n-type extended drain diffusions over the p-type buried diffusion and between a LDNMOS transistor gate and the LDNMOS drain;

implanting pwell dopant to form the body of the LDNMOS and to form a plurality of vertical pwell finger diffusions between the vertical n-type extended drain diffusions;

implanting p-type dopant at low energy into the channel of an NMOS transistor to set a turn on voltage of the NMOS transistor and into a channel of the LDNMOS transistor to set a turn on voltage;

forming an NMOS transistor gate, a PMOS transistor gate, and a first LDNMOS transistor gate and a second LDNMOS transistor gate;

forming dielectric sidewalls on the NMOS transistor gate, the PMOS transistor gate, and the first LDNMOS transistor gate and the second LDNMOS transistor gate;

forming source and drain diffusions of the NMOS transistor self-aligned to the dielectric sidewalls on the NMOS transistor gate; and forming an LDNMOS source self-aligned to the dielectric sidewalls on the first LDNMOS transistor gate and the second LDNMOS transistor gate wherein the LDNMOS source lies between the first and second LDNMOS transistor gates and forming an LDNMOS drain wherein the LDNMOS drain is shared by the first and second LDNMOS transistor gates wherein the plurality of vertical n-type extended drain diffusions form a plurality of vertical LDNMOS channels between the source and the drain of the first LDNMOS transistor and wherein a first horizontal LDNMOS channel is formed between the source and drain of the first LDNMOS transistor in the buried n-type diffusion which lies under the buried p-type diffusion and over the p-type substrate and wherein a second horizontal channel is formed between the source and drain of the second LDNMOS transistor in the buried n-type diffusion.

5. The process of claim 4 further comprising:

during the step of forming the buried p-type diffusion forming a plurality of buried p-type diffusions wherein plurality of buried p-type diffusions underlie the plurality of vertical pwell finger diffusions.

6. The process of claim 4, wherein the buried n-type dopant is phosphorus with a concentration in the range of about $3E12/cm^2$ to $8E12/cm^2$ that is implanted with energy in the range of about 500 KeV to 3000 KeV;

the buried p-type dopant is boron with a concentration in the range of about $4E12/cm^2$ to $1E13/cm^2$ that is implanted with an energy in the range of about 50 KeV to 300 KeV;

the n-type vertical extended drain dopant is phosphorus with a concentration in the range of about $2E12/cm^2$ to $8E12/cm^2$ that is implanted with energy in the range of about 200 KeV to 600 KeV; and the pwell dopant is boron with a concentration in the range of about $1E13/cm^2$ to $2E14/cm^2$ that is implanted with an energy in the range of about 50 KeV to 200 KeV.

* * * * *